United States Patent
Wang et al.

(10) Patent No.: US 12,101,102 B2
(45) Date of Patent: Sep. 24, 2024

(54) DECODING METHOD AND APPARATUS

(71) Applicant: Huawei Technologies Co., Ltd., Shenzhen (CN)

(72) Inventors: Xianbin Wang, Hangzhou (CN); Huazi Zhang, Hangzhou (CN); Rong Li, Hangzhou (CN); Jiajie Tong, Hangzhou (CN); Shengchen Dai, Hangzhou (CN); Jun Wang, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 18/301,724

(22) Filed: Apr. 17, 2023

(65) Prior Publication Data
US 2023/0261676 A1    Aug. 17, 2023

Related U.S. Application Data

(63) Continuation of application No. PCT/CN2021/120108, filed on Sep. 24, 2021.

(30) Foreign Application Priority Data

Oct. 20, 2020    (CN) .......................... 202011125229.X

(51) Int. Cl.
*H03M 13/45*    (2006.01)
(52) U.S. Cl.
CPC ................................ *H03M 13/451* (2013.01)
(58) Field of Classification Search
None
See application file for complete search history.

(56) References Cited

U.S. PATENT DOCUMENTS

| | | | |
|---|---|---|---|
| 2003/0201932 A1* | 10/2003 | Rabinowitz | G01S 5/14 342/357.29 |
| 2010/0223524 A1 | 9/2010 | Duggan et al. | |
| 2018/0343017 A1* | 11/2018 | Kumar | H03M 13/1111 |
| 2018/0358988 A1 | 12/2018 | Sharon et al. | |

(Continued)

FOREIGN PATENT DOCUMENTS

| | | |
|---|---|---|
| CN | 1551508 A | 12/2004 |
| CN | 108880568 A | 11/2018 |
| CN | 109921803 A | 6/2019 |

(Continued)

*Primary Examiner* — Guerrier Merant
(74) *Attorney, Agent, or Firm* — Conley Rose, P.C.

(57) ABSTRACT

A decoding method includes: decoding first to-be-decoded information based on a first decoder to obtain a first decoding result that includes first soft information or a first hard output; and correcting the first decoding result based on a first correction model to obtain a corrected first decoding result of the first to-be-decoded information. The first correction model is obtained through training based on training data that includes a training decoding result and a corrected training decoding result. The training decoding result is a decoding result obtained after the first decoder decodes training to-be-decoded information, and the corrected training decoding result is a corrected decoding result corresponding to the training decoding result. In this way, after a decoder performs decoding, a decoding result can be corrected based on a correction model.

20 Claims, 9 Drawing Sheets

(56) References Cited

U.S. PATENT DOCUMENTS

2021/0202028 A1\* 7/2021 Choi ................ G11C 29/4401
2022/0255558 A1   8/2022 Wang

FOREIGN PATENT DOCUMENTS

| CN | 110098838 A | 8/2019 |
| CN | 110515760 A | 11/2019 |
| CN | 110730006 A | 1/2020 |
| CN | 110798225 A | 2/2020 |
| CN | 111200441 A | 5/2020 |

\* cited by examiner

500

S510 — Decode first to-be-decoded information based on a first decoder, to obtain a first decoding result S520 — Correct the first decoding result based on a first correction model, to obtain a corrected first decoding result of the first to-be-decoded information

S610 — Decode first to-be-decoded information based on a first decoder, to obtain a first decoding result S620 — Correct the first decoding result based on a first correction model, to obtain a corrected first decoding result of the first to-be-decoded information S630 — Decode second to-be-decoded information based on a second decoder, to obtain a second decoding result, where the second to-be-decoded information includes a modulation symbol received by the first decoder from a channel and the corrected first decoding result S640 — Correct the second decoding result based on a second correction model, to obtain a corrected second decoding result of the second to-be-decoded information

```
┌─────────────────────────────────────────────────────────────┐
│ Decode first to-be-decoded information based on a first     │─── S710
│ decoder, to obtain a first decoding result                  │
└─────────────────────────────────────────────────────────────┘
                              │
┌─────────────────────────────────────────────────────────────┐
│ Correct the first decoding result based on a first          │─── S720
│ correction model, to obtain a corrected first decoding      │
│ result of the first to-be-decoded information               │
└─────────────────────────────────────────────────────────────┘
                              │
┌─────────────────────────────────────────────────────────────┐
│ Decode second to-be-decoded information based on a second   │─── S730
│ decoder, to obtain a second decoding result, where the      │
│ second to-be-decoded information includes a modulation      │
│ symbol received by the first decoder from a channel and     │
│ the corrected first decoding result                         │
└─────────────────────────────────────────────────────────────┘
                              │
┌─────────────────────────────────────────────────────────────┐
│ Correct the second decoding result based on a second        │─── S740
│ correction model, to obtain a corrected second decoding     │
│ result of the second to-be-decoded information              │
└─────────────────────────────────────────────────────────────┘
                              │
┌─────────────────────────────────────────────────────────────┐
│ Decode $N^{th}$ to-be-decoded information based on an       │─── S750
│ $N^{th}$ decoder, to obtain an $N^{th}$ decoding result,    │
│ where the $N^{th}$ to-be-decoded information includes a     │
│ modulation symbol received by the $N^{th}$ decoder from a   │
│ channel, a corrected $(N-1)^{th}$ decoding result, and a    │
│ corrected $(N-2)^{th}$ decoding result, and the $N^{th}$    │
│ decoding result includes $N^{th}$ soft information or an    │
│ $N^{th}$ hard output                                        │
└─────────────────────────────────────────────────────────────┘
                              │
┌─────────────────────────────────────────────────────────────┐
│ Correct the $N^{th}$ decoding result based on an $N^{th}$   │─── S760
│ correction model, to obtain a corrected $N^{th}$ decoding   │
│ result of the $N^{th}$ to-be-decoded information            │
└─────────────────────────────────────────────────────────────┘
```

FIG. 7

DECODING METHOD AND APPARATUS

CROSS-REFERENCE TO RELATED APPLICATIONS

This is a continuation of International Patent Application No. PCT/CN2021/120108 filed on Sep. 24, 2021, which claims priority to Chinese Patent Application No. 202011125229.X filed on Oct. 20, 2020. The disclosures of the aforementioned applications are hereby incorporated by reference in their entireties.

TECHNICAL FIELD

This application relates to the field of communication technologies, and more specifically, to a decoding method and apparatus.

BACKGROUND

Polar codes have a great development and application prospect in a 5th generation (5G) communication system. The polar code may also be a polar code. The polar code is a linear code block. It has been theoretically proved that the polar code is an encoding manner that can achieve a Shannon capacity and has low encoding and decoding complexity. An encoding output of the polar code may be expressed as $x_1^N = u_1^N G_N$. $u_1^N = \{u_1, u_2, \ldots, u_N\}$ is a binary row vector whose length is N. $G_N$ is an N×N matrix, and $G_N = B_N F^{\otimes n}$, where a code length is N=2, and n≥0. Herein, $$F = \begin{bmatrix} 1 & 0 \\ 1 & 1 \end{bmatrix},$$

$B_N$ is a transposed matrix, and $F^{\otimes n}$ is a Kronecker power and is defined as $F^{\otimes n} = F \otimes F^{\otimes (n-1)}$.

In a polar code encoding process, some bits in $u_1^N$ are used to carry information (namely, data information that needs to be sent to a receive end), the bits are referred to as information bits, and an index set of the bits is denoted as A. Remaining bits have fixed values, and are referred to as frozen bits. For example, the bits may be usually set to 0.

In the conventional technology, in a polar code decoding method, different inner code decoders can be configured based on different requirements for complexity and performance. Two different modes may be configured. The first mode is a high-performance mode, where a soft output subcode decoding unit is configured to perform, for example, SCL decoding or SCAN decoding. In this mode, an inner code decoder obtains soft bit information, and directly outputs a decoding result based on the soft bit information. This mode has disadvantages that a decoding kernel area is large, soft information needs to be transmitted between different subcodes, and an interconnection cable is complex.

The second mode is a high-throughput mode, where a hard output subcode decoding unit is configured to perform, for example, successive cancellation (SC) decoding. In this mode, an output side of a decoder outputs a decoded bit. The decoded bit is a decoding result obtained by performing hard decision on a soft information sequence. Because this mode lacks reliability information, decoding performance is poor.

Therefore, it is expected to provide a technology that can improve decoding performance when an interconnection cable is simple.

SUMMARY

Embodiments of the present disclosure provide a decoding method and apparatus, so that decoding performance can be improved when an interconnection cable is simple.

According to a first aspect, a decoding method is provided. The method includes: decoding first to-be-decoded information based on a first decoder, to obtain a first decoding result, where the first decoding result includes first soft information or a first hard output; and correcting the first decoding result based on a first correction model, to obtain a corrected first decoding result of the first to-be-decoded information. The first correction model is obtained through training based on training data, the training data includes a training decoding result and a corrected training decoding result, the training decoding result is a decoding result obtained after the first decoder decodes training to-be-decoded information, and the corrected training decoding result is a corrected decoding result corresponding to the training decoding result.

According to the solution provided in this application, when the first decoder and the first correction model perform the decoding method provided in this application, the first decoder decodes the first to-be-decoded information to obtain the first decoding result, and trains the first correction model based on the training decoding result and the corrected training decoding result. The trained first correction model corrects the first decoding result, to obtain a final decoding result corresponding to the first to-be-decoded information, namely, the corrected first decoding result. Compared with the manner in which the first decoder directly obtains a decoding result, this solution improves decoding performance.

With reference to the first aspect, in another implementation of the first aspect, the first to-be-decoded information includes a symbol received by the first decoder from a channel.

With reference to the first aspect and any one of the foregoing implementations of the first aspect, in another implementation of the first aspect, the decoding first to-be-decoded information based on a first decoder further includes: determining, based on a first determining unit, whether the first to-be-decoded information is a codeword.

According to the solution in this application, the first to-be-decoded information can be determined before the first decoder decodes the first to-be-decoded information. The first to-be-decoded information is decoded only when it is determined that the first to-be-decoded information is a codeword. This further improves decoding efficiency of the solution in this application.

With reference to the first aspect and any one of the foregoing implementations of the first aspect, in another implementation of the first aspect, the method further includes: decoding second to-be-decoded information based on a second decoder, to obtain a second decoding result, where the second to-be-decoded information includes a symbol received by the first decoder from a channel and the corrected first decoding result, and the second decoding result includes second soft information or a second hard output; and correcting the second decoding result based on a second correction model, to obtain a corrected second decoding result of the second to-be-decoded information.

According to the solution in this application, when the first decoder, the first correction model, the second decoder, and the second correction model perform the decoding method provided in this application, the first decoding result corrected by using the first correction model is used as an input of the second decoder, and the second decoder performs decoding again to obtain the second decoding result. The second correction model corrects the second decoding result to finally obtain a second decoding result that is corrected by using the first correction model and the second correction model and that corresponds to the first to-be-decoded information, so that decoding performance of the solution in this application can be further improved.

With reference to the first aspect and any one of the foregoing implementations of the first aspect, in another implementation of the first aspect, the decoding second to-be-decoded information based on a second decoder further includes: determining, based on a second determining unit, whether the second to-be-decoded information is a codeword.

With reference to the first aspect and any one of the foregoing implementations of the first aspect, in another implementation of the first aspect, the method further includes: decoding $N^{th}$ to-be-decoded information based on an $N^{th}$ decoder, to obtain an $N^{th}$ decoding result, where the $N^{th}$ to-be-decoded information includes a symbol received by the $N^{th}$ decoder from a channel, a corrected $(N-1)^{th}$ decoding result, and a corrected $(N-2)^{th}$ decoding result, the $N^{th}$ decoding result includes $N^{th}$ soft information or an $N^{th}$ hard output, and N is an integer greater than or equal to 3; and correcting the $N^{th}$ decoding result based on an $N^{th}$ correction model, to obtain a corrected $N^{th}$ decoding result of the $N^{th}$ to-be-decoded information.

According to the solution in this application, when N decoders and N correction models perform the decoding method provided in this application, a plurality of times of iterative decoding and a plurality of times of correction by using the correction model are performed on the first to-be-decoded information, to finally obtain the corrected $N^{th}$ decoding result corresponding to the first to-be-decoded information, so that decoding performance of the solution in this application can be improved.

With reference to the first aspect and any one of the foregoing implementations of the first aspect, in another implementation of the first aspect, the decoding $N^{th}$ to-be-decoded information based on an $N^{th}$ decoder further includes: determining, based on a determining unit, whether the $N^{th}$ to-be-decoded information is a codeword.

With reference to the first aspect and any one of the foregoing implementations of the first aspect, in another implementation of the first aspect, the method further includes: encoding a training information bit sequence, to obtain the training to-be-decoded information, where the training information bit sequence is the corrected training decoding result; decoding the training to-be-decoded information based on the first decoder, to obtain the training decoding result; inputting the training decoding result into an original correction model, to obtain a training decoding result corrected by using the original correction model; and adjusting a parameter of the original correction model until a deviation between the training decoding result corrected by using the original correction model and the training information bit sequence meets a preset condition, where an adjusted original correction model is the first correction model.

According to a second aspect, a decoding apparatus is provided. The apparatus includes: a first structure decoding unit, configured to decode first to-be-decoded information, to obtain a first decoding result, where the first decoding result includes first soft information or a first hard output; and a first correction unit, configured to correct the first decoding result, to obtain a corrected first decoding result of the first to-be-decoded information. The first correction unit is obtained through training based on training data, the training data includes a training decoding result and a corrected training decoding result, the training decoding result is a decoding result obtained after the first structure decoding unit decodes training to-be-decoded information, and the corrected training decoding result is a corrected decoding result corresponding to the training decoding result.

With reference to the second aspect, in another implementation of the second aspect, the first structure decoding unit is specifically configured to receive a symbol from a channel.

With reference to the second aspect and any one of the foregoing implementations of the second aspect, in another implementation of the second aspect, based on the first structure decoding unit decoding the first to-be-decoded information, the decoding apparatus further includes: a first determining unit, configured to determine whether the first to-be-decoded information is a codeword.

With reference to the second aspect and any one of the foregoing implementations of the second aspect, in another implementation of the second aspect, the decoding apparatus further includes: decoding second to-be-decoded information based on a second structure decoding unit, to obtain a second decoding result, where the second to-be-decoded information includes a symbol received by the second structure decoding unit from a channel and the corrected first decoding result, and the second decoding result includes second soft information or a second hard output; and correcting the second decoding result based on a second correction unit, to obtain a corrected second decoding result of the second to-be-decoded information.

With reference to the second aspect and any one of the foregoing implementations of the second aspect, in another implementation of the second aspect, based on the second structure decoding unit decoding the second to-be-decoded information, the decoding apparatus further includes: a second determining unit, configured to determine whether the second to-be-decoded information is a codeword.

With reference to the second aspect and any one of the foregoing implementations of the second aspect, the decoding apparatus further includes: decoding $N^{th}$ to-be-decoded information based on an $N^{th}$ structure decoding unit, to obtain an $N^{th}$ decoding result, where the $N^{th}$ to-be-decoded information includes a symbol received by the $N^{th}$ structure decoding unit from a channel, a corrected $(N-1)^{th}$ decoding result, and a corrected $(N-2)^{th}$ decoding result, the $N^{th}$ decoding result includes $N^{th}$ soft information or an $N^{th}$ hard output, and N is an integer greater than or equal to 3; and correcting the $N^{th}$ decoding result based on an $N^{th}$ correction unit, to obtain a corrected $N^{th}$ decoding result of the $N^{th}$ to-be-decoded information.

With reference to the second aspect and any one of the foregoing implementations of the second aspect, in another implementation of the second aspect, based on the $N^{th}$ structure decoding unit decoding the $N^{th}$ to-be-decoded information, the decoding apparatus further includes: an $N^{th}$ determining unit, configured to determine whether the $N^{th}$ to-be-decoded information is a codeword.

With reference to the second aspect and any one of the foregoing implementations of the second aspect, the apparatus further includes: encoding a training information bit sequence, to obtain the training to-be-decoded information, where the training information bit sequence is the corrected training decoding result; decoding the training to-be-decoded information based on the first decoding unit, to obtain the training decoding result; inputting the training decoding result into an original correction unit, to obtain a training decoding result corrected by using the original correction unit; and adjusting a parameter of the original correction unit until a deviation between the training decoding result corrected by using the original correction unit and the training information bit sequence meets a preset condition, where an adjusted original correction unit is the first correction unit.

According to a third aspect, a chip system is provided. The chip system includes a processor, configured to invoke a computer program from a memory and run the computer program, so that a device on which the chip system is installed is enabled to perform the method according to the implementations of the first aspect.

According to a fourth aspect, a computer program product is provided. The computer program product includes computer program code. When the computer program code is run by a communication unit, a processing unit, a transceiver, or a processor in a communication device (for example, a terminal device or a network device), the communication device is enabled to perform the method according to the implementations of the first aspect.

According to a fifth aspect, a computer-readable storage medium is provided. The computer-readable storage medium stores a program. The program enables a communication device (for example, a terminal device or a network device) to perform the method according to the implementations of the first aspect.

BRIEF DESCRIPTION OF DRAWINGS

FIG. 5 is a schematic diagram of a decoding method performed by a single decoding module according to an embodiment of the present disclosure;

FIG. 6 is a schematic diagram of a decoding method performed by two decoding modules according to an embodiment of the present disclosure;

FIG. 7 is a schematic diagram of a decoding method performed by a plurality of decoding modules according to an embodiment of the present disclosure;

DESCRIPTION OF EMBODIMENTS

The following describes technical solutions of this application with reference to accompanying drawings.

The technical solutions provided in this application may be applied to various wireless communication systems, for example, a Long-Term Evolution (LTE) system, an LTE frequency division duplex (FDD) system, an LTE time-division duplex (TDD) system, a Universal Mobile Telecommunication System (UMTS), a Worldwide Interoperability for Microwave Access (WiMAX) wireless communication system, a 5G mobile wireless communication system, or a new radio access technology, and a future communication system, such as a sixth generation mobile wireless communication system. This is not limited in this application. The 5G mobile wireless communication system may include a non-standalone (NSA) communication system and/or a standalone (SA) communication system, and in particular, include an enhanced mobile broadband (eMBB) scenario, an ultra reliable low latency communication (uRLLC) scenario, and a massive machine type communication (mMTC) scenario in 5G.

The technical solutions provided in this application may be further applied to a machine type communication (MTC) network, an LTE-machine (LTE-M) type communication technology, a device-to-device (D2D) network, a machine to machine (M2M) network, an internet of things (IoT) network, or another network. The IoT network may include, for example, the internet of vehicles. Communication modes in an internet of vehicles system are collectively referred to as vehicle to X (V2X, where X may represent anything). For example, the V2X may include vehicle to vehicle (V2V) communication, vehicle-to-infrastructure (V2I) communication, vehicle-to-pedestrian (V2P) communication, or vehicle-to-network (V2N) communication.

To facilitate understanding of embodiments of this application, a wireless communication system 100 to which a method according to embodiments of this application is applicable is first described in detail with reference to FIG. 1.

Figure 1:
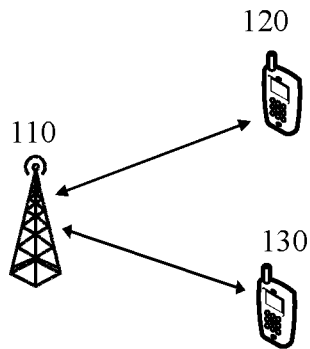
FIG. 1 is a schematic diagram of an application scenario of a wireless communication system according to an embodiment of the present disclosure.

FIG. 1 is a schematic diagram of the wireless communication system 100 to which the method according to embodiments of this application is applicable. As shown in the figure, the wireless communication system 100 includes a network device 110, a terminal device 120, and a terminal device 130.

A decoding method provided in embodiments of this application may be applied to an information exchange process between the network device and the terminal device, and may be performed by software or hardware on the network device side or the terminal device side. A decoding apparatus provided in embodiments of this application may be deployed on a radio access network device, such as a base station or a controller, to process received uplink data sent by a mobile terminal, or may be deployed on a mobile terminal, to process received downlink data sent by a radio access network device.

The network device in embodiments of this application may be any device having a wireless transceiver function. The device includes but is not limited to an evolved NodeB (eNB), a radio network controller (RNC), a NodeB (NB), a base station controller (BSC), a base transceiver station (BTS), a home base station (for example, a home eNB, or a home NB), a baseband unit (BBU), an access point (AP) in a Wi-Fi system, a wireless relay node, a wireless backhaul node, a transmission point (TP), a transmission and reception point (TRP), or the like. Alternatively, the device may be a gNB or a transmission point (TRP or TP) in a 5G system such as an NR system, may be one antenna panel or a group (including a plurality of antenna panels) of antenna panels of a base station in a 5G system, or may be a network node, such as a baseband unit (BBU) or a distributed unit (DU), that constitutes a gNB or a transmission point.

The terminal device in embodiments of this application may be user equipment (UE), a mobile station (MS), a mobile terminal (MT), an access terminal, a subscriber unit, a subscriber station, a mobile station, a remote station, a remote terminal, a mobile device, a user terminal, a terminal, a wireless communication device, a user agent, a user apparatus, or the like.

The terminal device may be a device that provides voice/data connectivity for a user, for example, a handheld device or a vehicle-mounted device having a wireless connection function. Currently, some examples of the terminal may be: a mobile phone, a tablet computer (e.g., a pad), a computer (for example, a notebook computer or a palmtop computer) having a wireless transceiver function, a mobile internet device (MID), a virtual reality (virtual reality, VR) device, an augmented reality (AR) device, a wireless terminal in industrial control, a wireless terminal in self driving, a wireless terminal in telemedicine (e.g., remote medical), a wireless terminal in a smart grid, a wireless terminal in transportation safety, a wireless terminal in a smart city, a wireless terminal in a smart home, a cellular phone, a cordless phone, a session initiation protocol (SIP) phone, a wireless local loop (WLL) station, a personal digital assistant (PDA), a handheld device having a wireless communication function, a computing device, another processing device connected to a wireless modem, a vehicle-mounted device, a wearable device, a terminal device in a 5G network, or a terminal device in a future evolved public land mobile network (PLMN).

It should be noted that the wireless communication system 100 shown in FIG. 1 is only intended to describe the technical solutions of this application more clearly, but is not intended to limit this application. A person of ordinary skill in the art may know that as a network architecture evolves and a new service scenario emerges, the technical solutions provided in this application are also applicable to a similar technical problem.

Figure 2:
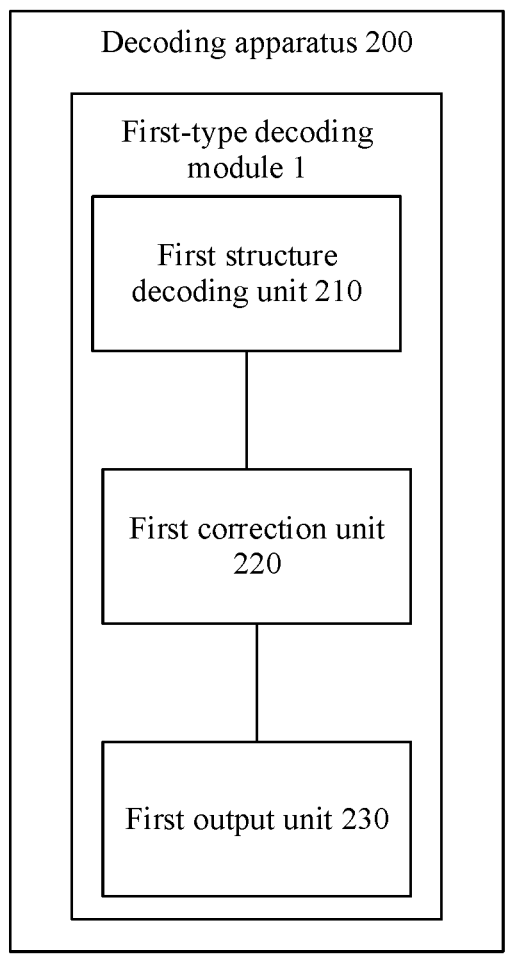
FIG. 2 is a schematic diagram of a decoding apparatus including a single decoding module according to an embodiment of the present disclosure.

With reference to FIG. 2, the following describes a schematic diagram of a decoding apparatus including a single decoding module according to an embodiment of the present disclosure. As shown in FIG. 2, the decoding apparatus 200 includes a single decoding module, in other words, includes only a first-type decoding module 1. The first-type decoding module 1 includes but is not limited to a first structure decoding unit 210, a first correction unit 220, and a first output unit 230. The first structure decoding unit may be directly communicatively connected to the first correction unit, the first correction unit may be directly communicatively connected to the first output unit, and the first output unit may be directly communicatively connected to a structure decoding unit of another decoding module.

The first structure decoding unit 210, the first correction unit 220, and the first output unit 230 each include an input port and an output port. Specifically, the output port of the first structure decoding unit 210 is connected to the input port of the first correction unit 220, and the output port of the first correction unit 220 is connected to the input port of the first output unit 230.

The first correction unit 220 stores a first correction model.

In this embodiment of the present disclosure, the first structure decoding unit 210 decodes first to-be-decoded information, to obtain a first decoding result. The first decoding result includes first soft information or a first hard output.

The first structure decoding unit 210 may be a conventional decoding unit, specifically, for example, an SC decoding unit, an SCAN decoding unit, or an SCL decoding unit. It should be understood that the decoding unit mentioned above is merely an example, and constitutes no limitation on the protection scope of embodiments of this application.

Specifically, a decoding method in which the first structure decoding unit 210 decodes a symbol received from a channel may include but is not limited to the following: an SC decoding method, an SCL decoding method, an SCAN decoding method, a sum product method, a mini-sum method, a Chase decoding method, an ordered statistics decoding method, or a box-and-match decoding method. It may be understood that another decoding method may also be applied to the described first structure decoding unit, and falls within the protection scope of this application.

The first to-be-decoded information may be the symbol received by the first structure decoding unit 210 from the channel. Specifically, the first to-be-decoded information may also be referred to as a to-be-decoded codeword, a to-be-decoded code block, a code block, or a codeword.

A log likelihood ratio (LLR) vector whose length is N and that corresponds to the first to-be-decoded information reaches a last level after an F/G operation is performed at one or more levels, and a soft information sequence at the last level (namely, an LLR vector at the last level) is the first decoding result.

Alternatively, bit-by-bit hard decision is performed based on a soft information sequence at a last level (namely, an LLR vector at the last level), to obtain a decoded bit on an information side, namely, the first decoding result. For a non-fixed bit position, when hard decision is performed, if an LLR>0, a decision result is 0; or if an LLR<0, a decision result is 1. For a fixed bit position, when hard decision is performed, a decision result is 0 regardless of a value of an LLR.

After the decoding result is obtained, the first correction unit 220 receives the decoding result and corrects the decoding result, to obtain a corrected first decoding result corresponding to the symbol received from the channel.

In this embodiment of the present disclosure, the first correction unit performs a correction process based on the first correction model. The first correction model may be pre-trained by an external training device, or the first correction model may be obtained through training by the first correction unit.

In this embodiment of the present disclosure, the first correction model may be obtained through training based on machine learning or deep learning. Based on the machine learning or the deep learning, the first correction model may be a network. Specifically, for example, the first correction model may be a fully-connected neural network model, a single neuron model, or an AI model. The first correction model has an input layer and an output layer, and there is at least one hidden layer between the input layer and the output layer. There may be a nonlinear activation function for processing such as an activation function (e.g., a rectified linear unit (ReLU)) or a hyperbolic tangent (tanh) function behind the hidden layer. A connection between layers is formed by a mutual connection between nodes on each layer, and a pair of connected nodes has a weight value and a bias value. A deep neural network may be considered as nonlinear transformation from an input to an output. A loss function may be input in the output to calculate a loss. A gradient generated through calculation may be returned from the output layer to the input layer according to a backpropagation algorithm, to update a weight and a bias of each layer and minimize the loss.

Specifically, the first correction model is obtained by training an original correction model based on the training data according to a machine learning or deep learning training method. In this embodiment of this application, training data #A includes to-be-decoded information #A1 (namely, an example of training decoding information), a decoding result #A2 (namely, an example of a training decoding result), and an expected decoding result #A3 (namely, an example of a corrected training decoding result). The decoding result #A2 is a decoding result obtained after the first structure decoding unit performs decoding. It should be noted that, in actual application, the training data may be collected by a data collection device, or may be received from another device. In addition, it should be noted that an external training device does not necessarily train the first correction model completely based on the training data, or may obtain training data from a cloud or another device for model training. The foregoing description should not be construed as a limitation on this embodiment of this application.

Specifically, in this embodiment provided in this application, a process of training the first correction model is as follows:

Step 1: Encode an information bit sequence to obtain to-be-decoded information, where the information bit sequence is an expected decoding result.

Step 2: Decode the to-be-decoded information based on the first structure decoding unit, to obtain a decoding result.

Step 3: Input the decoding result into the original correction model, to obtain a decoding result corrected by using the original correction model.

Step 4: Adjust parameters of the original correction model, until a deviation between the decoding result corrected by using the original correction unit and the information bit sequence meets a preset condition, where the parameters of the original correction model are specifically a bias B and a weight W of each layer, and an adjusted original correction model is the first correction model.

Specifically, the deviation between the decoding result corrected by using the original correction model and the information bit sequence is calculated according to the following formula:

$$E = \frac{1}{2}\sum_{k=1}^{m}(Y_k - O_k)^2 \quad \text{Formula (1)}$$

$Y_k$ is each bit in the information bit sequence, and $O_k$ is each bit of the decoding result corrected by using the original correction model. k=1, 2, . . . , m, where m is a natural number greater than 1, and indicates that the information bit sequence or the decoding result has m bits.

Specifically, the parameters of the original correction model are specifically the bias B and the weight W of each layer, until the deviation between the decoding result corrected by using the original correction model and the information bit sequence meets the preset condition. The preset condition may be that a calculation result of the deviation is 0.

In this embodiment of the present disclosure, the first correction model may alternatively be obtained through training based on deep reinforcement learning, and the deep reinforcement learning is a combination of a deep neural network and reinforcement learning. The reinforcement learning is a process in which an agent interacts with an environment and learns an optimal policy through trial and error (or exploration). The reinforcement learning can provide solutions to problems that have a series of decisions, especially problems that cannot be theoretically modeled or are difficult to solve. A reinforcement learning system may also include the following concepts: a state (or an observation), a policy, a return, a time step, an episode, and a value function. The policy determines an action taken by the agent in a given state, that is, a mapping from the state to the action. In the deep reinforcement learning, the observation may be an input of the deep neural network, and the action corresponds to an output of the deep neural network. The return is a value fed back by the environment after the agent takes an action in the current environment. The agent takes an action at each time step, and then the environment feeds back a return value. Usually, problems encountered cannot be solved by optimizing a single action, but solved by a final or comprehensive result brought by optimizing a series of decisions. Therefore, in a process of optimizing a problem by the reinforcement learning, an episode may be used as a unit, and each episode includes a plurality of time steps. The environment may feed back a return only at a time step at an end of an episode, and in this case, a return of a previous time step may be replaced with zero. Certainly, the environment may also feed back a non-zero return before an episode ends. Different environments have different feedback manners. Based on a return fed back by the environment, a goal of the agent is to maximize a total return of each episode. The value function is also a mapping. An input of the value function may be a state or a set of a state and an action. An output is a value, and the value indicates an estimated value of a total return that can be accumulated by the agent in the future. A larger value indicates that a currently selected action is better in the long run. In the deep reinforcement learning, the value function may alternatively be represented by the deep neural network. An input of the value function is an input of the deep neural network, and an output of the value function is an output of the deep neural network. Reinforcement learning belongs to a category of unsupervised learning, does not need to label training samples in advance, and can learn better configuration than a human design. A training process is performed offline, and therefore decoding complexity is not affected.

Specifically, in this embodiment of the present disclosure, the first correction model may be trained according to a genetic algorithm.

It should be understood that the foregoing enumerated process of training the first correction model according to the genetic algorithm is merely an example for description. This application is not limited thereto. Another training method in which the parameters of the original correction model are adjusted according to a reinforcement learning algorithm to obtain the first correction model falls within the protection scope of this application.

In this embodiment of the present disclosure, when the first correction model is a fully-connected neural network, decoding performance may be improved after an appropriate parameter is learned by adjusting the parameters in the foregoing training process.

In this embodiment of the present disclosure, the first correction model is in a mode in which there is only one neuron. This simplified implementation can greatly reduce complexity of training a large quantity of parameters, and can further improve decoding performance.

It should be understood that the foregoing enumerated form of the first correction model being a fully-connected neural network or a neuron is merely an example for description. This application is not limited thereto. Another model for which parameters are adjusted based on training may also be used as the first correction model, and falls within the protection scope of this application.

In this embodiment of the present disclosure, the first-type decoding module 1 further includes the first output unit 230, configured to output the first decoding result corrected by using the first correction unit.

Specifically, the first output unit 230 is configured to output, to a second structure decoder and a third structure decoder, the first decoding result corrected by using the first correction unit, or output the first decoding result to an $N^{th}$ structure decoder and an $(N+1)^{th}$ structure decoder as an input.

It should be understood that, in this embodiment of the present disclosure, when the decoding apparatus includes only a single first-type decoding module 1, an input of the decoding apparatus is the first to-be-decoded information. The first-type decoding module 1 performs decoding processing, and an output result is the corrected first decoding result corresponding to the first to-be-decoded information.

According to the solution provided in this application, the first structure decoding unit decodes the first to-be-decoded information, to obtain the first decoding result. The first correction unit corrects the first decoding result, to obtain the corrected first decoding result of the first to-be-decoded information. In this way, a solution in which a decoding result of a conventional decoding unit may be corrected is provided. Compared with a solution in the conventional technology, this solution can improve decoding performance.

Figure 3:
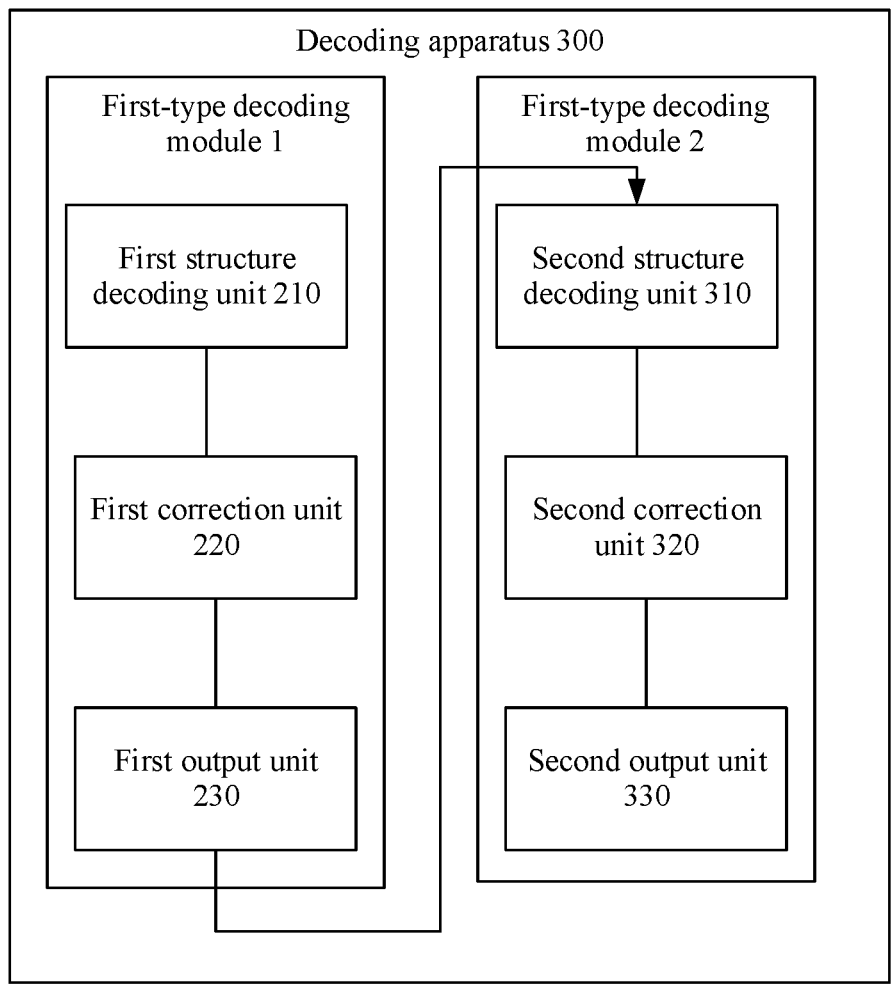
FIG. 3 is a schematic diagram of a decoding apparatus including two decoding modules according to an embodiment of the present disclosure.

In a case, the decoding apparatus in this embodiment of the present disclosure may alternatively include two decoding modules. As shown in FIG. 3, a decoding apparatus 300 includes two first-type decoding modules: a first-type decoding module 1 and a first-type decoding module 2. The first-type decoding module 1 is described in FIG. 2, and details are not described herein again. Similarly, the first-type decoding module 2 includes but is not limited to a second structure decoding unit 310, a second correction unit 320, and a second output unit 330. The second structure decoding unit may be directly communicatively connected to the first output unit, the second structure decoding unit may also be directly communicatively connected to the second correction unit. The second correction unit may be directly communicatively connected to the second output unit, and the second output unit may be directly communicatively connected to a structure decoding unit of another decoding module.

The second structure decoding unit 310, the second correction unit 320, and the second output unit 330 each include an input port and an output port. Specifically, the input port of the second structure decoding unit 310 is connected to the output port of the first output unit 230, the output port of the second structure decoding unit 310 is connected to the input port of the second correction unit 320, and the output port of the second correction unit 320 is connected to the input port of the second output unit 330.

The second correction unit 320 stores a second correction model.

In this embodiment of the present disclosure, a function performed by the first-type decoding module 1 is described in FIG. 2. First, the first structure decoding unit 210 decodes first to-be-decoded information, to obtain a decoding result. Second, after the decoding result is obtained, the first correction unit 220 receives the decoding result and corrects the decoding result, to obtain a corrected first decoding result corresponding to a symbol received from a channel. Finally, the first output unit 230 outputs, as an input of the second structure decoding unit, the first decoding result corrected by using the first correction unit.

In this embodiment of the present disclosure, an external device performs probability superposition on the symbol transmitted in the channel and the result output by the first output unit, to obtain second to-be-decoded information. The second structure decoder receives the second to-be-decoded information and decodes the second to-be-decoded information, to obtain a second decoding result.

Similarly, the second structure decoding unit 310 may also be a conventional decoding unit, specifically, for example, an SC decoding unit, an SCAN decoding unit, or an SCL decoding unit. It should be understood that the second structure decoding unit may be the same as the first structure decoding unit, for example, both are SC decoding units; or the second structure decoding unit may be different from the first structure decoding unit.

Specifically, a decoding method in which the second structure decoding unit 310 decodes the symbol received from the channel or the output result received from the first output unit may include but is not limited to the following: an SC decoding method, an SCL decoding method, an SCAN decoding method, a sum product method, a mini-sum method, a Chase decoding method, an ordered statistics decoding method, or a box-and-match decoding method. It may be understood that another decoding method may also be applied to the described first structure decoding unit, and falls within the protection scope of this application.

The output result received from the first output unit may be soft information or hard bits obtained after hard decision is performed.

After the decoding result of the second structure decoder is obtained, the second correction unit 320 receives the decoding result and corrects the decoding result, to obtain a corrected second decoding result of the second to-be-decoded information.

In this embodiment of the present disclosure, the second correction unit performs a correction process based on the second correction model. The second correction model may be pre-trained by an external training device, or the second correction model may be obtained through training by the second correction unit.

In this embodiment of the present disclosure, the second correction model may be obtained through training based on machine learning or deep learning, or the second correction model may be obtained through training based on deep reinforcement learning. This is the same as the training method of the first correction model.

Specifically, the second correction model is obtained by training an original correction model based on the training data according to a machine learning or deep learning training method. In this embodiment of this application, training data #A includes to-be-decoded information #A1 (namely, an example of training decoding information), a decoding result #A2 (namely, an example of a training decoding result), and an expected decoding result #A3 (namely, an example of a corrected training decoding result). The decoding result #A2 is a decoding result obtained after the second structure decoding unit performs decoding. It should be noted that, in actual application, the training data may be collected by a data collection device, or may be received from another device. In addition, it should be noted that the external training device does not necessarily train the second correction model completely based on the training data, or may obtain training data from a cloud or another device for model training. The foregoing description should not be construed as a limitation on this embodiment of this application.

Specifically, in this embodiment provided in this application, a process of training the second correction model is as follows:

Step 1: Encode an information bit sequence to obtain to-be-decoded information, where the information bit sequence is an expected decoding result.

Step 2: Decode the to-be-decoded information based on the second structure decoding unit, to obtain a decoding result.

Step 3: Input the decoding result into the original correction model, to obtain a decoding result corrected by using the original correction model.

Step 4: Adjust parameters of the original correction model, until a deviation between the decoding result corrected by using the original correction unit and the information bit sequence meets a preset condition, where the parameters of the original correction model are specifically a bias B and a weight W of each layer, and an adjusted original correction model is the second correction model.

Specifically, the deviation between the decoding result corrected by using the original correction model and the information bit sequence is calculated according to the formula 1.

Specifically, the parameters of the original correction model are specifically the bias B and the weight W of each layer, until the deviation between the decoding result corrected by using the original correction model and the information bit sequence meets the preset condition. The preset condition may be that a deviation result calculated according to the formula 1 is 0.

Specifically, in this embodiment of the present disclosure, the second correction model may alternatively be trained according to a gradient descent algorithm.

It should be understood that the foregoing enumerated process of training the second correction model according to the gradient descent algorithm is merely an example for description. This application is not limited thereto. Another training method in which the parameters of the original correction model are adjusted according to a reinforcement learning algorithm to obtain the second correction model falls within the protection scope of this application.

Same as the first correction model, in this embodiment of the present disclosure, the second correction model may be a fully-connected neural network, and decoding performance may be improved after an appropriate parameter is learned by adjusting the parameters in the foregoing training process. Alternatively, the second correction model may be in a mode in which there is only one neuron. This simplified implementation can greatly reduce complexity of training a large quantity of parameters, and can further improve decoding performance.

It should be understood that the foregoing enumerated form of the second correction model being a fully-connected neural network or a neuron is merely an example for description. This application is not limited thereto. Another model for which parameters are adjusted based on training may also be used as the second correction model, and falls within the protection scope of this application.

In this embodiment of the present disclosure, the first-type decoding module 2 further includes the second output unit 330, configured to output the second decoding result corrected by using the second correction unit.

Specifically, the second output unit 330 is configured to output, to a third structure decoder and a fourth structure decoder, the second decoding result corrected by using the second correction unit, or output the second decoding result to an $N^{th}$ structure decoder and an $(N+1)^{th}$ structure decoder as an input.

Specifically, the symbol received by the second structure decoding unit from the channel and the corrected first decoding result are jointly used as the second to-be-decoded information of the second structure decoding unit 310. The second structure decoding unit 310 decodes the second to-be-decoded information, to obtain the second decoding result. The second decoding result may be soft information or a hard output obtained after hard decision is performed. Subsequently, the second correction unit 320 corrects the second decoding result. The second correction unit 320 is also obtained through training based on the training data.

In this embodiment of the present disclosure, when the decoding apparatus includes two first-type decoding modules, namely, the first-type decoding module 1 and the first-type decoding module 2, an input of the decoding apparatus is the first to-be-decoded information, the two first-type decoding modules perform decoding processing, and an output is the corrected second decoding result output by the second output unit.

According to the solution provided in this application, the symbol input in the channel is processed by the first structure decoder 210, the first correction unit 220, and the first output unit 230, the obtained corrected first decoding result is transmitted to the second structure decoding unit 310, and the second correction unit 320 further corrects the first decoding result. Therefore, a decoding result of a decoder can be corrected, so that decoding performance is further improved.

Figure 4:
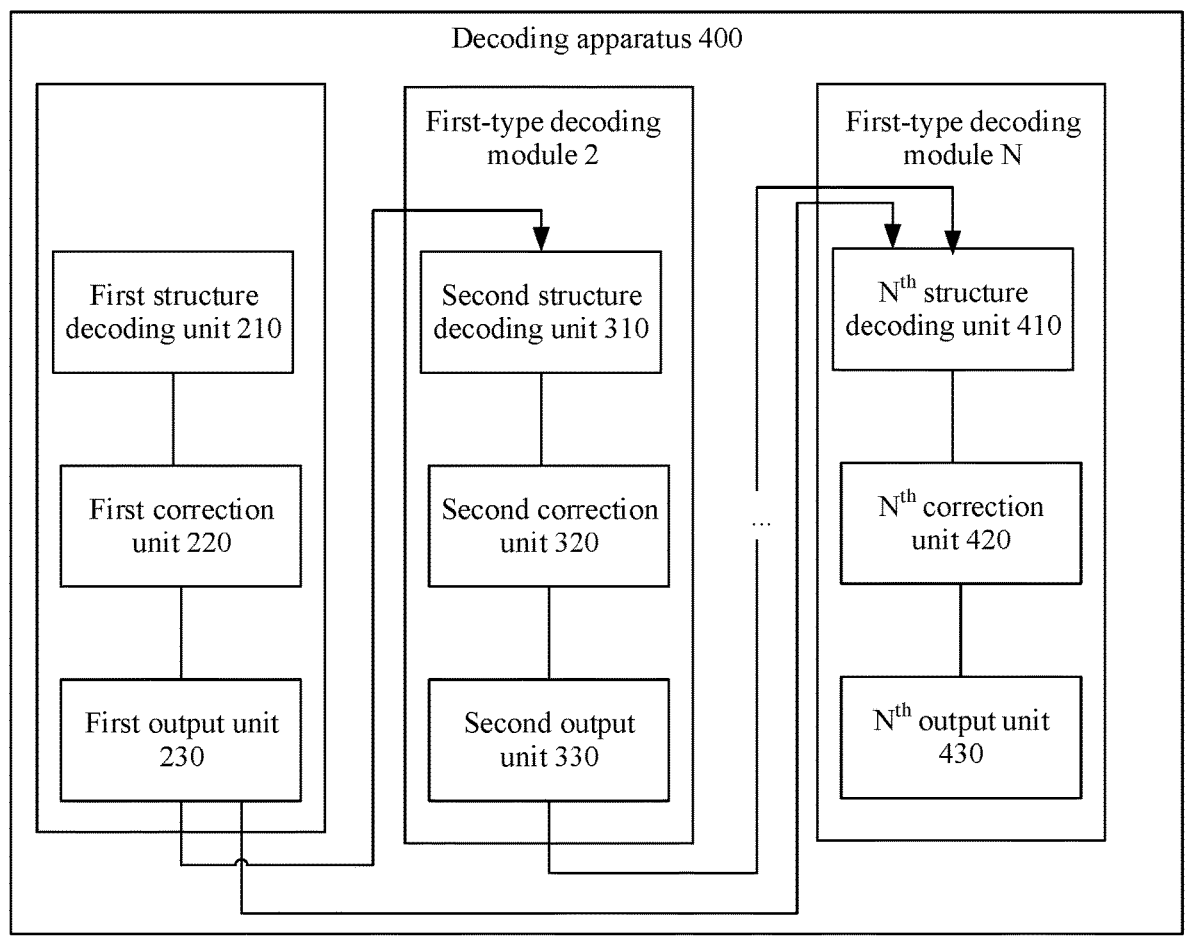
FIG. 4 is a schematic diagram of a decoding apparatus including a plurality of decoding modules according to an embodiment of the present disclosure.

In another case, the decoding apparatus in this embodiment of the present disclosure may include N decoding modules, where N is an integer greater than or equal to 3. As shown in FIG. 4, a decoding apparatus 400 includes N first-type decoding modules: a first-type decoding module 1, a first-type decoding module 2, and a first-type decoding module N. Specifically, for example, the decoding apparatus 400 may include the first-type decoding module 1, the first-type decoding module 2, and a first-type decoding module 3. Alternatively, the decoding apparatus 400 may include the first-type decoding module 1, the first-type decoding module 2, a first-type decoding module 3, and a first-type decoding module 4. A specific quantity of included decoding modules is not limited in this application, and another decoding apparatus including a plurality of first-type decoding modules falls within the protection scope of this application.

The first-type decoding module 1 and the first-type decoding module 2 are described in FIG. 3, and details are not described herein again. Similarly, the first-type decoding module N includes but is not limited to an $N^{th}$ structure decoding unit 410, an $N^{th}$ correction unit 420, and an $N^{th}$ output unit 430. The $N^{th}$ structure decoding unit 410 may be directly communicatively connected to an $(N-1)^{th}$ output unit, the $N^{th}$ structure decoding unit 410 may also be directly communicatively connected to an $(N-2)^{th}$ output unit, the $N^{th}$ structure decoding unit may be directly communicatively connected to the $N^{th}$ correction unit, and the $N^{th}$ correction unit may be directly communicatively connected to the $N^{th}$ output unit.

The $N^{th}$ structure decoding unit 410, the $N^{th}$ correction unit 420, and the $N^{th}$ output unit 430 each include an input port and an output port. Specifically, an external device performs a probability superposition operation on an output result of the $(N-1)^{th}$ output unit and an output result of the $(N-2)^{th}$ output unit, and an obtained result is used as an input of the $N^{th}$ structure decoding unit 410. The output port of the $N^{th}$ structure decoding unit 410 is connected to the input port of the $N^{th}$ correction unit, and the output port of the $N^{th}$ correction unit is connected to the input port of the $N^{th}$ output unit.

The $N^{th}$ correction unit 420 stores an $N^{th}$ correction model.

In this embodiment of the present disclosure, a function performed by the first-type decoding module 1 is described in FIG. 2. First, the first structure decoding unit 210 decodes first to-be-decoded information, to obtain a decoding result. Second, after the decoding result is obtained, the first correction unit 220 receives the decoding result and corrects the decoding result, to obtain a corrected first decoding result corresponding to a symbol received from a channel. Finally, the first output unit 230 outputs, as an input of the second structure decoding unit, the first decoding result corrected by using the first correction unit.

A function performed by the first-type decoding module 2 is described in FIG. 3. First, a result obtained through probability superposition of the symbol received by the second structure decoding unit 310 from the channel and the corrected first decoding result is used as second to-be-decoded information of the second structure decoding unit 310, and the second structure decoding unit 310 decodes the second to-be-decoded information, to obtain a second decoding result. The second decoding result may be soft information or a hard output obtained after hard decision is performed. Subsequently, the second correction unit 320 corrects the second decoding result. The second correction unit 320 is also obtained through training based on the training data. A training manner is described above. Finally, the second output unit 330 outputs, as an input of the $N^{th}$ structure decoding unit, the second decoding result corrected by using the second correction unit.

In this embodiment of the present disclosure, an external device performs probability superposition on the symbol transmitted in the channel, the output result of the $(N-1)^{th}$ output unit, and the output result of the $(N-2)^{th}$ output unit, to obtain $N^{th}$ to-be-decoded information. The $N^{th}$ structure decoder receives the $N^{th}$ to-be-decoded information and decodes the $N^{th}$ to-be-decoded information, to obtain an $N^{th}$ decoding result.

Similarly, the $N^{th}$ structure decoding unit 410 may also be a conventional decoding unit, specifically, for example, an SC decoding unit, an SCAN decoding unit, or an SCL decoding unit. It should be understood that the $N^{th}$ structure decoding unit may be the same as the first structure decoding unit or the second structure decoding unit, for example, both are SC decoding units. Alternatively, the $N^{th}$ structure decoding unit may be different from the first structure decoding unit, and may be the same as the second structure decoding unit. Alternatively, the $N^{th}$ structure decoding unit is the same as the first structure decoding unit, and is different from the second structure decoding unit.

Specifically, a decoding method in which the $N^{th}$ structure decoding unit 410 decodes a result obtained through probability superposition of the symbol received from the channel, the received output result of the $(N-1)^{th}$ output unit, and the received output result of the $(N-2)^{th}$ output unit may include but is not limited to the following: an SC decoding method, an SCL decoding method, an SCAN decoding method, a sum product method, a mini-sum method, a Chase decoding method, an ordered statistics decoding method, or a box-and-match decoding method. It may be understood that another decoding method may also be applied to the described $N^{th}$ structure decoding unit, and falls within the protection scope of this application.

The received output result of the $(N-1)^{th}$ output unit or the received output result of the $(N-2)^{th}$ output unit may be soft information or hard bits obtained after hard decision is performed.

After a decoding result of the $N^{th}$ structure decoder is obtained, the $N^{th}$ correction unit 420 receives the decoding result and corrects the decoding result, to obtain a corrected $N^{th}$ decoding result of the $N^{th}$ to-be-decoded information. The $N^{th}$ decoding result includes $N^{th}$ soft information or an $N^{th}$ hard output, where N is an integer greater than or equal to 3.

In this embodiment of the present disclosure, the $N^{th}$ correction unit performs a correction process based on the $N^{th}$ correction model. The $N^{th}$ correction model may be pre-trained by an external training device, or the $N^{th}$ correction model may be obtained through training by the $N^{th}$ correction unit.

In this embodiment of the present disclosure, the $N^{th}$ correction model may be obtained through training based on machine learning or deep learning, or the $N^{th}$ correction model may be obtained through training based on deep reinforcement learning. This is the same as the training methods of the first correction model and the second correction model.

Specifically, the $N^{th}$ correction model is obtained by training the original correction model based on the training data according to a machine learning or deep learning training method. In this embodiment of this application, training data #A includes to-be-decoded information #A1 (namely, an example of training decoding information), a decoding result #A2 (namely, an example of a training decoding result), and an expected decoding result #A3 (namely, an example of a corrected training decoding result). The decoding result #A2 is a decoding result obtained after the $N^{th}$ structure decoding unit performs decoding. It should be noted that, in actual application, the training data may be collected by a data collection device, or may be received from another device. In addition, it should be noted that the external training device does not necessarily train the $N^{th}$ correction model completely based on the training data, or may obtain training data from a cloud or another device for model training. The foregoing description should not be construed as a limitation on this embodiment of this application.

Specifically, in this embodiment provided in this application, a process of training the $N^{th}$ correction model is as follows:

Step 1: Encode an information bit sequence to obtain to-be-decoded information, where the information bit sequence is an expected decoding result.

Step 2: Decode the to-be-decoded information based on the $N^{th}$ structure decoding unit, to obtain a decoding result.

Step 3: Input the decoding result into the original correction model, to obtain a decoding result corrected by using the original correction model.

Step 4: Adjust parameters of the original correction model, until a deviation between the decoding result corrected by using the original correction unit and the information bit sequence meets a preset condition, where the parameters of the original correction model are specifically a bias B and a weight W of each layer, and an adjusted original correction model is the $N^{th}$ correction model.

Specifically, the deviation between the decoding result corrected by using the original correction model and the information bit sequence is calculated according to the formula 1.

Specifically, the parameters of the original correction model are specifically the bias B and the weight W of each layer, until the deviation between the decoding result corrected by using the original correction model and the information bit sequence meets the preset condition. The preset condition may be that a deviation result calculated according to the formula 1 is 0.

Specifically, in this embodiment of the present disclosure, the $N^{th}$ correction model may alternatively be trained according to a gradient descent algorithm.

It should be understood that the foregoing enumerated process of training the $N^{th}$ correction model according to the gradient descent algorithm is merely an example for description. This application is not limited thereto. Another training method in which the parameters of the original correction model are adjusted according to a reinforcement learning algorithm to obtain the $N^{th}$ correction model falls within the protection scope of this application.

Same as the first correction model and the second correction model, in this embodiment of the present disclosure, the $N^{th}$ correction model may be a fully-connected neural network, and decoding performance may be improved after an appropriate parameter is learned by adjusting the parameters in the foregoing training process. Alternatively, the $N^{th}$ correction model may be in a mode in which there is only one neuron. This simplified implementation can greatly reduce complexity of training a large quantity of parameters, and can further improve decoding performance.

It should be understood that the foregoing enumerated form of the $N^{th}$ correction model being a fully-connected neural network or a neuron is merely an example for description. This application is not limited thereto. Another model for which parameters are adjusted based on training may also be used as the $N^{th}$ correction model, and falls within the protection scope of this application.

In this embodiment of the present disclosure, the decoding module further includes the $N^{th}$ output unit 430, configured to output the $N^{th}$ decoding result corrected by using the $N^{th}$ correction unit.

Specifically, the $N^{th}$ output unit 430 is configured to output, to an $(N+1)^{th}$ structure decoder and an $(N+2)^{th}$ structure decoder, the $N^{th}$ decoding result corrected by using the $N^{th}$ correction unit.

Specifically, the symbol received by the $N^{th}$ structure decoding unit 410 from the channel, a corrected $(N-1)^{th}$ decoding result, and a corrected $(N-2)^{th}$ decoding result are jointly used as an input of the $N^{th}$ structure decoding unit 410, namely, the $N^{th}$ to-be-decoded information. The $N^{th}$ structure decoding unit 410 decodes the $N^{th}$ to-be-decoded information, to obtain the $N^{th}$ decoding result. Subsequently, the $N^{th}$ correction unit 420 corrects the $N^{th}$ decoding result, to obtain the corrected $N^{th}$ decoding result of the $N^{th}$ to-be-decoded information.

Therefore, in this embodiment of the present disclosure, in the decoding apparatus 400 including a plurality of decoding modules, the first output unit 230 may output, to the second structure decoding unit 310, the first decoding result corrected by using the first correction unit 220, or may output, to the $N^{th}$ structure decoding unit 410, the first decoding result corrected by using the first correction unit 220, where N is an integer greater than or equal to 3. This connection relationship provides an iterative decoding manner. In the decoding apparatus including N first-type decoding modules, the $N^{th}$ correction unit further corrects the corrected $(N-1)^{th}$ decoding result and the corrected $(N-2)^{th}$ decoding result, to finally obtain a corrected $N^{th}$ decoding result corresponding to the first to-be-decoded information. In this way, an output of each decoding module can be corrected by using a next decoding module, so that decoding performance is improved.

FIG. 5 shows a decoding method performed by a single decoding module according to an embodiment of the present disclosure, that is, the first-type decoding module 1 performs the decoding method described in FIG. 5. It should be noted that the decoding method provided in this embodiment of this application may be performed by a network device, or may be performed by a terminal. The decoding method provided in this embodiment of this application may be applied to various wireless communication scenarios, is mainly applied to communication between a base station and a terminal on a 60 GHz frequency band, and may be applied to, but is not limited to, an enhanced mobile broadband (eMBB) scenario, a massive machine type communication (mMTC) scenario, and an ultra reliable low latency communication (URLLC) scenario. As shown in FIG. 5, the method includes the following steps.

S510: Decode first to-be-decoded information based on a first decoder, to obtain a first decoding result, where the first decoding result includes first soft information or a first hard output.

S520: Correct the first decoding result based on a first correction model, to obtain a corrected first decoding result of the first to-be-decoded information.

In this embodiment of this application, the first decoder is a conventional decoder, specifically, for example, an SC decoder or a soft cancellation (SCAN) decoder. It should be understood that the decoder mentioned above is merely an example, and constitutes no limitation on the protection scope of embodiments of this application.

Specifically, in S510, a decoding method in which the first decoder decodes the first to-be-decoded information may include but is not limited to the following: an SC decoding method, an SC list (SCL) decoding method, a SCAN decoding method, a sum product method, a mini-sum (mini-sum) method, a Chase decoding method, an ordered statistics decoding method, or a box-and-match decoding method. It may be understood that another decoding method may also be applied to the described first decoder, and falls within the protection scope of this application.

The first to-be-decoded information may be a symbol received by the first decoder from a channel. Specifically, the first to-be-decoded information may also be referred to as a to-be-decoded codeword, a to-be-decoded code block, a code block, or a codeword. An LLR vector that has a length of N and that corresponds to the first to-be-decoded information reaches a last level after an F/G operation is performed at one or more levels, and a soft information sequence at the last level (namely, an LLR vector at the last level) is a decoded bit on an information side, that is, the first decoding result is obtained.

Optionally, bit-by-bit hard decision is performed based on a soft information sequence at a last level (namely, an LLR vector at the last level), to obtain a decoded bit on an information side, in other words, to obtain the first decoding result. For a non-fixed bit position, when hard decision is performed, if an LLR>0, a decision result is 0; or if an LLR<0, a decision result is 1. For a fixed bit position, when hard decision is performed, a decision result is 0 regardless of a value of an LLR.

Subsequently, in S520, the first decoding result may be corrected based on the first correction model, to obtain the corrected first decoding result of the first to-be-decoded information.

In this embodiment of the present disclosure, the first correction model may be obtained through training based on machine learning or deep learning. Based on the machine learning or the deep learning, the first correction model may be a network. Specifically, for example, the first correction model may be a fully-connected neural network model, a single neuron model, or an AI model.

Specifically, the first correction model is obtained by training an original correction model based on training data according to a machine learning or deep learning training method. In this embodiment of this application, training data #A includes to-be-decoded information #A1 (namely, an example of training decoding information), a decoding result #A2 (namely, an example of a training decoding result), and an expected decoding result #A3 (namely, an example of a corrected training decoding result). The decoding result #A2 is a decoding result obtained after the first structure decoding unit performs decoding. It should be noted that, in actual application, the training data may be collected by a data collection device, or may be received from another device. In addition, it should be noted that an external training device does not necessarily train the first correction model completely based on the training data, or may obtain training data from a cloud or another device for model training. The foregoing description should not be construed as a limitation on this embodiment of this application.

Specifically, in this embodiment provided in this application, a process of training the first correction model is as follows:

Step 1: Encode an information bit sequence to obtain to-be-decoded information, where the information bit sequence is an expected decoding result.

Step 2: Decode the to-be-decoded information based on the first structure decoding unit, to obtain a decoding result.

Step 3: Input the decoding result into the original correction model, to obtain a decoding result corrected by using the original correction model.

Step 4: Adjust parameters of the original correction model, until a deviation between the decoding result corrected by using the original correction unit and the information bit sequence meets a preset condition, where the parameters of the original correction model are specifically a bias B and a weight W of each layer, and an adjusted original correction model is the first correction model.

Specifically, the deviation between the decoding result corrected by using the original correction model and the information bit sequence is calculated according to the formula 1.

Specifically, the parameters of the original correction model are specifically the bias B and the weight W of each layer, until the deviation between the decoding result corrected by using the original correction model and the information bit sequence meets the preset condition. The preset condition may be that a calculation result of the deviation is 0.

In this application, parameter adjustment is performed on the original correction model to obtain the first correction model, or parameter adjustment may be performed according to a reinforcement learning algorithm. A training process is performed offline, and therefore decoding complexity is not affected. Reinforcement learning belongs to a category of unsupervised learning, does not need to label training samples in advance, and can learn better configuration than a human design.

In this embodiment of the present disclosure, the first correction model may be trained according to a genetic algorithm. The genetic algorithm gradually finds an optimal parameter by simulating a population evolution in natural selection.

When the algorithm is started, a population including N individuals is generated, where a parameter of each individual is randomly generated. The population is sorted by performance. Individuals with good performance are ranked first, and individuals with poor performance are ranked last.

Then, the algorithm enters the following cyclic process:

Step 1: Selection: Randomly select two nodes from the population as a father and a mother, where a probability that an individual ranked first is selected is higher than a probability that an individual ranked last is selected.

Step 2: Hybridization: Hybridize the father and the mother to generate a descendant, where each parameter of the descendant is obtained by selecting one of corresponding parameters of the father and the mother.

Step 3: Mutation: Perform mutation on the parameter of the newly generated descendant, where each parameter mutates with a probability of p; and if mutation occurs, a Gaussian noise is randomly added to the parameter, otherwise, the parameter remains unchanged.

Step 4: Population update: Evaluate performance of the descendant and insert the descendant into an original population in a performance order, where if performance of the newly generated descendant is worse than that of all the individuals in the original population, the sample is directly discarded.

The process of step 1 to step 4 is repeatedly performed until a preset maximum quantity of iterations is reached.

Finally, an individual parameter with the best performance is output as a final training result.

It should be understood that the foregoing enumerated process of training the first correction model according to the genetic algorithm is merely an example for description. This application is not limited thereto. Another training method in which the parameters of the original correction model are adjusted according to a reinforcement learning algorithm to obtain the first correction model falls within the protection scope of this application.

Optionally, in this embodiment of the present disclosure, the first correction model may be a fully-connected neural network. The fully-connected neural network may include a neuron. The neuron may be an operation unit for which $X_s$ and an intercept of 1 are used as an input. An output of the operation unit may be as follows:

$$h_{w,b}(x) = f(W^T x) = f\left(\sum_{s=1}^{n} W_s x_s + b\right)$$

s=1, 2, . . . , and n, where n is a natural number greater than 1. $W_s$ is a weight of $X_s$, and b is a bias of the neuron. f is an activation function of the neuron, and is used to introduce a nonlinear feature into the fully-connected neural network, to convert an input signal in the neuron into an output signal. The output signal of the activation function may serve as an input of a next convolution layer. The activation function may be a sigmoid function. The fully-connected network includes N layers of neurons, where N is greater than or equal to 2. The neural network is a network formed by connecting a plurality of single neurons. In other words, an output of one neuron may be an input of another neuron. Specifically, each connection line and each neuron separately correspond to a trainable parameter, that is, the weight $W_s$ and the bias b of the neuron. A parameter is adjusted in the foregoing training process, so that decoding performance can be improved.

Optionally, the first correction model may be in a mode in which there is only one neuron. This simplified implementation can greatly reduce complexity of training a large quantity of parameters, and can further improve decoding performance.

It should be understood that the foregoing enumerated form of the first correction model being a fully-connected neural network or a neuron is merely an example for description. This application is not limited thereto. Another model for which parameters are adjusted based on training may also be used as the first correction model, and falls within the protection scope of this application.

In this embodiment of this application, the decoding result corrected by using the first correction model is output by the first output unit in the decoding module 1.

In this embodiment of this application, when the first decoder, the first correction model, and the first output unit perform the decoding method, a final decoding result corresponding to the first to-be-decoded information is the corrected first decoding result.

According to the solution provided in this application, the first decoder decodes the first to-be-decoded information, to obtain the first decoding result. The first decoding result is corrected based on the first correction model, to obtain the corrected first decoding result of the first to-be-decoded information. In this way, a solution in which a decoding result of a conventional decoder may be corrected is provided. Compared with a solution in the conventional technology, this embodiment of this application enables an output result of the conventional decoder to be corrected, so that decoding performance can be improved.

FIG. 6 shows a decoding method performed by two decoding modules according to an embodiment of the present disclosure. The two decoding modules herein are the first-type decoding module 1 and the first-type decoding module 2. As shown in FIG. 6, the method includes the following steps.

S610: Decode first to-be-decoded information based on a first decoder, to obtain a first decoding result, where the first decoding result includes first soft information or a first hard output.

S620: Correct the first decoding result based on a first correction model, to obtain a corrected first decoding result of the first to-be-decoded information.

S630: Decode second to-be-decoded information based on a second decoder, to obtain a second decoding result, where the second to-be-decoded information includes a symbol received by the first decoder from a channel and the corrected first decoding result.

S640: Correct the second decoding result based on a second correction model, to obtain a corrected second decoding result of the second to-be-decoded information.

Specifically, in S630, the second decoder and the first decoder may be a same conventional decoder or different conventional decoders. Specifically, for example, the second decoder may be an SC decoder or an SCAN decoder. It should be understood that the decoder mentioned above is merely an example, and constitutes no limitation on the protection scope of embodiments of this application.

Specifically, in S630, a decoding method in which the second decoder decodes the second to-be-decoded information may also be the same as the decoding method in which the first decoder decodes the first decoding information. A specific decoding method may include but is not limited to the following: an SC decoding method, an SCL decoding method, an SCAN decoding method, a sum product method, a mini-sum method, a Chase decoding method, an ordered statistics decoding method, or a box-and-match decoding method. It may be understood that another decoding method may also be applied to the described second decoder, and falls within the protection scope of this application.

Specifically, in S630, the second to-be-decoded information received by the second decoder is the symbol received by the first decoder from the channel and the first decoding result corrected by using the first correction model.

Specifically, in S640, the second decoding result is corrected based on the second correction model, to obtain the corrected second decoding result of the second to-be-decoded information.

In this embodiment of the present disclosure, the second correction model may be pre-trained by an external training device, or the second correction model may be obtained through training by the second correction unit in the first-type decoding module 2.

In this embodiment of the present disclosure, the second correction model may be obtained through training based on machine learning or deep learning, or the second correction model may be obtained through training based on deep reinforcement learning. This is the same as the training method of the first correction model.

Specifically, the second correction model is obtained by training an original correction model based on the training data according to a machine learning or deep learning training method. In this embodiment of this application, training data #A includes to-be-decoded information #A1 (namely, an example of training decoding information), a decoding result #A2 (namely, an example of a training decoding result), and an expected decoding result #A3 (namely, an example of a corrected training decoding result). The decoding result #A2 is a decoding result obtained after the second structure decoding unit performs decoding. It should be noted that, in actual application, the training data may be collected by a data collection device, or may be received from another device. In addition, it should be noted that the external training device does not necessarily train the second correction model completely based on the training data, or may obtain training data from a cloud or another device for model training. The foregoing description should not be construed as a limitation on this embodiment of this application.

Specifically, in this embodiment provided in this application, a process of training the second correction model is as follows:

Step 1: Encode an information bit sequence to obtain to-be-decoded information, where the information bit sequence is an expected decoding result.

Step 2: Decode the to-be-decoded information based on the second structure decoding unit, to obtain a decoding result.

Step 3: Input the decoding result into the original correction model, to obtain a decoding result corrected by using the original correction model.

Step 4: Adjust parameters of the original correction model, until a deviation between the decoding result corrected by using the original correction unit and the information bit sequence meets a preset condition, where the parameters of the original correction model are specifically a bias B and a weight W of each layer, and an adjusted original correction model is the second correction model.

Specifically, the deviation between the decoding result corrected by using the original correction model and the information bit sequence is calculated according to the formula 1.

Specifically, the parameters of the original correction model are specifically the bias B and the weight W of each layer, until the deviation between the decoding result corrected by using the original correction model and the information bit sequence meets the preset condition. The preset condition may be that a deviation result calculated according to the formula 1 is 0.

Specifically, in this embodiment of the present disclosure, the second correction model may alternatively be trained according to a gradient descent algorithm.

It should be understood that the foregoing enumerated process of training the second correction model according to the gradient descent algorithm is merely an example for description. This application is not limited thereto. Another training method in which the parameters of the original correction model are adjusted according to a reinforcement learning algorithm to obtain the second correction model falls within the protection scope of this application.

Same as the first correction model, in this embodiment of the present disclosure, the second correction model may be a fully-connected neural network, and decoding performance may be improved after an appropriate parameter is learned by adjusting the parameters in the foregoing training process. Alternatively, the second correction model may be in a mode in which there is only one neuron. This simplified implementation can greatly reduce complexity of training a large quantity of parameters, and can further improve decoding performance.

It should be understood that the foregoing enumerated form of the second correction model being a fully-connected neural network or a neuron is merely an example for description. This application is not limited thereto. Another model for which parameters are adjusted based on training may also be used as the second correction model, and falls within the protection scope of this application.

In this embodiment of the present disclosure, the second decoding result corrected by using the second correction model is output by the second output unit.

In this embodiment of the present disclosure, the first to-be-decoded information is processed by the first decoder, the first correction model, the second decoder, and the second correction model, and finally an obtained decoding result corresponding to the first to-be-decoded information is the corrected second decoding result.

According to the solution provided in this application, the symbol received by the first decoder from the channel and the corrected first decoding result are jointly used as an input of the second decoder. The second decoder decodes the second to-be-decoded information, to obtain the second decoding result. The second decoding result is corrected based on the second correction model, to obtain the corrected second decoding result of the second to-be-decoded information. In this way, an iterative decoding method is provided. When decoding fails after the first decoder and the first correction model perform processing, the second decoder and the second correction model may perform decoding again. Compared with the solution in the conventional technology, this solution can improve decoding performance.

FIG. 7 is a schematic diagram of a decoding method performed by a plurality of decoding modules according to an embodiment of the present disclosure. The decoding method shown in FIG. 7 is performed by a plurality of first-type decoding modules. The method includes the following steps.

S710: Decode first to-be-decoded information based on a first decoder, to obtain a first decoding result.

S720: Correct the first decoding result based on a first correction model, to obtain a corrected first decoding result of the first to-be-decoded information.

S730: Decode second to-be-decoded information based on a second decoder, to obtain a second decoding result, where the second to-be-decoded information includes a symbol received by the first decoder from a channel and the corrected first decoding result.

S740: Correct the second decoding result based on a second correction model, to obtain a corrected second decoding result of the second to-be-decoded information.

S750: Decode $N^{th}$ to-be-decoded information based on an $N^{th}$ decoder, to obtain an $N^{th}$ decoding result, where the $N^{th}$ to-be-decoded information includes a symbol received by the $N^{th}$ decoder from a channel, a corrected $(N-1)^{th}$ decoding result, and a corrected $(N-2)^{th}$ decoding result, and the $N^{th}$ decoding result includes $N^{th}$ soft information or an $N^{th}$ hard output.

S760: Correct the $N^{th}$ decoding result based on an $N^{th}$ correction model, to obtain a corrected $N^{th}$ decoding result of the $N^{th}$ to-be-decoded information.

A difference between the decoding method shown in FIG. 7 and the foregoing decoding method lies in an input of the $N^{th}$ decoder. Inputs of the $N^{th}$ decoder are the symbol received by the $N^{th}$ decoder from the channel, the corrected $(N-1)^{th}$ decoding result, and the corrected $(N-2)^{th}$ decoding result. The $N^{th}$ decoding result includes the $N^{th}$ soft information or the $N^{th}$ hard output, where N is an integer greater than or equal to 3. In other words, an output result of the first correction model may be used as an input of the second decoder, and may also be used as an input of the $N^{th}$ decoder.

Before decoding, the $N^{th}$ decoder performs probability superposition on the symbol received by the $N^{th}$ decoder from the channel, the corrected $(N-1)^{th}$ decoding result, and the corrected $(N-2)^{th}$ decoding result, to obtain soft information or hard bits of the to-be-decoded information. The $N^{th}$ decoder decodes the soft information or hard bits of the to-be-decoded information, and then the $N^{th}$ correction model performs correction. If corrected soft information or each of corrected hard bits is 0, it indicates that the $N^{th}$ decoder receives the symbol received from the channel, the corrected $(N-1)^{th}$ decoding result, and the corrected $(N-2)^{th}$ decoding result, but the $N^{th}$ decoder and the $N^{th}$ correction model are not used in an iterative decoding process.

In this embodiment of the present disclosure, a training process of the $N^{th}$ correction model is the same as the training process of the first correction model or the second correction model. Details are not described herein again.

In this embodiment of the present disclosure, N decoders and N correction models perform decoding processing on the first to-be-decoded information, and finally a decoding result corresponding to the first to-be-decoded information is the $N^{th}$ corrected decoding result.

According to the solution provided in this application, the $N^{th}$ decoder decodes the symbol received by the $N^{th}$ decoder from the channel, the corrected $(N-1)^{th}$ decoding result, and the corrected $(N-2)^{th}$ decoding result. The $N^{th}$ decoding result includes the $N^{th}$ soft information or the $N^{th}$ hard output, where N is an integer greater than or equal to 3. The $N^{th}$ decoder decodes the $N^{th}$ to-be-decoded information, to obtain the $N^{th}$ decoding result. The $N^{th}$ decoding result is corrected based on the $N^{th}$ correction model, to obtain the corrected $N^{th}$ decoding result of the $N^{th}$ to-be-decoded information. If each bit of the $N^{th}$ decoding result is 0, it indicates that the $N^{th}$ decoder and the $N^{th}$ correction model are not used in a parallel decoding process. In this way, a solution in which a decoding result of a conventional decoder may be corrected is provided. Compared with a solution in the conventional technology, this embodiment of this application enables an output result of the conventional decoder to be corrected, and the $N^{th}$ decoder and the $N^{th}$ correction model that need to be used to be autonomously selected, so that decoding performance can be improved.

Figure 8:
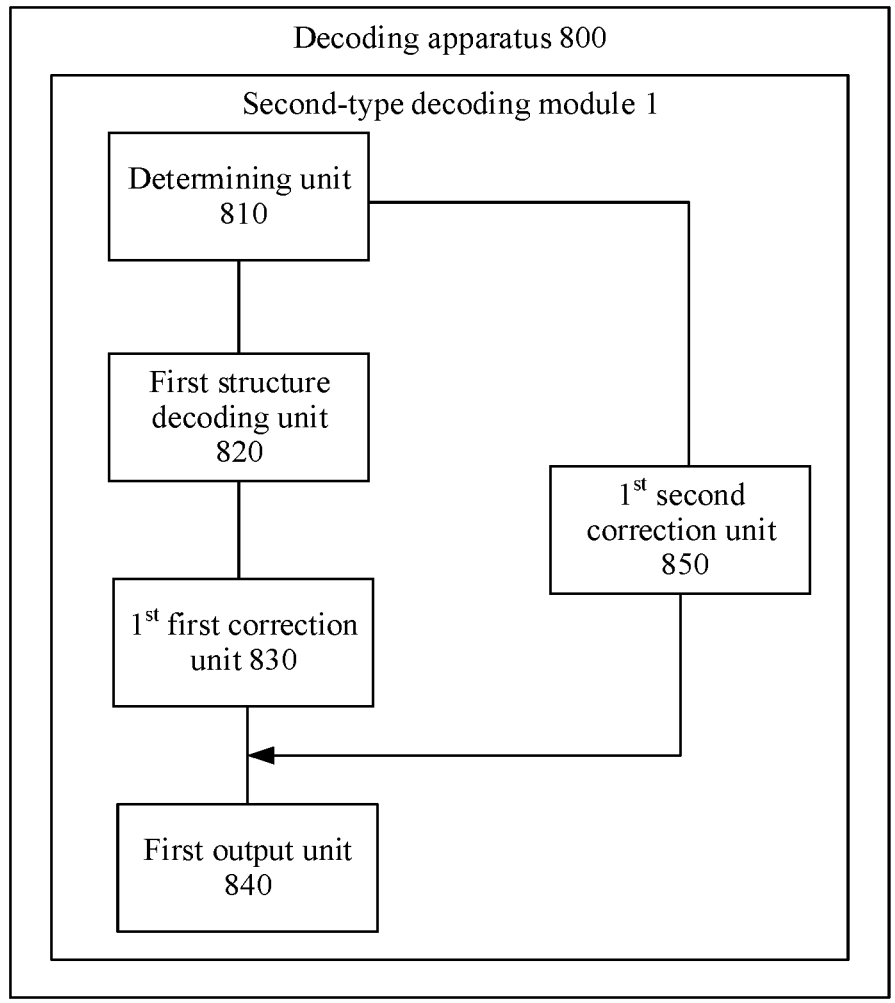
FIG. 8 is a schematic diagram of a decoding apparatus including a single decoding module of another type according to an embodiment of the present disclosure.

With reference to FIG. 8, the following describes a schematic diagram of a decoding apparatus including a single decoding module of another type according to an embodiment of the present disclosure. As shown in FIG. 8, the decoding apparatus 800 includes a single decoding module, in other words, includes only a second-type decoding module 1. The second-type decoding module 1 includes but is not limited to a determining unit 810, a first structure decoding unit 820, a $1^{st}$ first correction unit 830, a first output unit 840, and a $1^{st}$ second correction unit 850. The determining unit may be directly communicatively connected to the first structure decoding unit, and may also be directly communicatively connected to the $1^{st}$ second correction unit. The first structure decoding unit may be directly communicatively connected to the $1^{st}$ first correction unit. The $1^{st}$ first correction unit may be directly communicatively connected to the first output unit. The first output unit may be directly communicatively connected to a structure decoding unit of another decoding module. The $1^{st}$ second correction unit may be directly communicatively connected to the first output unit. The $1^{st}$ second correction unit is only directly communicatively connected to the determining unit and the first output unit.

The first structure decoding unit, the $1^{st}$ first correction unit, the $1^{st}$ second correction unit, and the first output unit each include an input port and an output port. The determining unit includes three ports, including one input port and two output ports. Specifically, the input port of the determining unit is configured to receive a symbol transmitted by a channel, one output port of the determining unit is connected to the input port of the first structure decoding unit, and the other output port of the determining unit is connected to the input port of the $1^{st}$ second correction unit. The output port of the first structure decoding unit is connected to the input port of the $1^{st}$ first correction unit, and the output port of the $1^{st}$ first correction unit is connected to the input port of the first output unit. The input port of the $1^{st}$ second correction unit is connected to the determining unit, and the output port of the $1^{st}$ second correction unit is connected to the input port of the first output unit.

The $1^{st}$ first correction unit stores a $1^{st}$ first correction model, and the $1^{st}$ second correction unit stores a $1^{st}$ second correction model.

In this embodiment of the present disclosure, the determining unit is specifically configured to determine whether first decoding information is a codeword. Determining whether the first to-be-decoded information is a codeword may be implemented through decoding based on Hamming code, and may be specifically implemented according to the following method:

$$c \times H = 0 \qquad \text{Formula (2)}$$

H represents a check matrix of the codeword, and c represents an input symbol sequence.

As described in the formula 2, if a calculation result of the formula 2 is 0, it indicates that the first to-be-decoded information is a codeword. The determining unit outputs a signal 0, and the first structure decoding unit receives the signal 0 output by the determining unit. In this case, the first structure decoding unit decodes the first to-be-decoded information, to obtain a first decoding result. A specific decoding method is the same as that of the first structure decoding unit 210 in FIG. 2. Details are not described herein again.

After the decoding result is obtained, the $1^{st}$ first correction unit receives the decoding result and corrects the decoding result, to obtain a corrected first decoding result corresponding to the symbol received from the channel.

In this embodiment of the present disclosure, the $1^{st}$ first correction unit performs a correction process based on the $1^{st}$ first correction model. The $1^{st}$ first correction model may be pre-trained by an external training device, or the $1^{st}$ first correction model may be obtained through training by the $1^{st}$ first correction unit.

In this embodiment of the present disclosure, a training method and a training process of the $1^{st}$ first correction model are the same as the training method and the training process of the first correction model. Similarly, the Pt first correction model may be a network. Specifically, for example, the Pt first correction model may be a fully-connected neural network model, a single neuron model, or an AI model.

In this embodiment of the present disclosure, the second-type decoding module 1 further includes the first output unit, configured to output the first decoding result corrected by using the $1^{st}$ first correction unit.

Optionally, if a calculation result of the formula 2 is not 0, it indicates that the first to-be-decoded information is not a codeword, and the determining unit outputs a signal 1. In this case, the $1^{st}$ second correction unit receives the signal 1 output by the determining unit and corrects the first to-be-decoded information, to obtain the corrected first decoding result of the first to-be-decoded information. Then, the first output unit directly outputs the corrected first decoding result.

In this embodiment of the present disclosure, the $1^{st}$ second correction unit performs a correction process based on the $1^{st}$ second correction model. The $1^{st}$ second correction model may be pre-trained by an external training device, or the $1^{st}$ second correction model may be obtained through training by the $1^{st}$ second correction unit.

In this embodiment of the present disclosure, a training method and a training process of the $1^{st}$ second correction model are the same as the training method and the training process of the first correction model. Similarly, the Pt second correction model may be a network. Specifically, for example, the $1^{st}$ second correction model may be a fully-connected neural network model, a single neuron model, or an AI model.

In this embodiment of the present disclosure, the first output unit 840 is configured to output the decoding result corrected by using the $1^{st}$ first correction model, or is configured to output the first decoding result corrected by using the $1^{st}$ second correction unit. Specifically, the first output unit 840 may output, to a second structure decoder and a third structure decoder, the first decoding result corrected by using the $1^{st}$ first correction unit or the $1^{st}$ second correction unit, or output the first decoding result to an $N^{th}$ structure decoder and an $(N+1)^{th}$ structure decoder as an input.

Specifically, before the first structure decoding unit 820 receives the symbol from the channel as the first to-be-decoded information, and the first structure decoding unit 820 decodes the first to-be-decoded information to obtain the first decoding result, the determining unit 810 performs hard decision on the first to-be-decoded information, to determine whether the first to-be-decoded information needs to be decoded. If it is determined that the first to-be-decoded information needs to be decoded, the first structure decoding unit 820 decodes the first to-be-decoded information, to obtain the first decoding result. The first decoding result may be soft information or a hard output obtained after hard decision is performed. Subsequently, the $1^{st}$ first correction unit 830 corrects the first decoding result. The $1^{st}$ first correction unit 830 is obtained through training based on training data. The training data includes a training decoding result and a corrected training decoding result. The training decoding result is a decoding result obtained after the first structure decoding unit 820 decodes training to-be-decoded information. The corrected training decoding result is a corrected decoding result corresponding to the training decoding result. If it is determined that the first decoding information does not need to be decoded, the $1^{st}$ second correction unit 850 corrects the first decoding information, and the first output unit 840 outputs corrected first decoding result.

It should be understood that, in this embodiment of the present disclosure, when the decoding apparatus includes only a single second-type decoding module 1, an output result of the decoding apparatus is the corrected first decoding result output by the first output unit.

Therefore, in the single decoding module of another type in this embodiment of the present disclosure, the determining unit is added to first determine to-be-decoded information. When the determining unit determines that the to-be-decoded information needs to be decoded, the first structure decoding unit and the first correction unit perform processing, and the first output unit outputs a final corrected first decoding result corresponding to the first to-be-decoded information. When the determining unit determines that the to-be-decoded information does not need to be decoded, the $1^{st}$ second correction unit corrects a result, the first structure decoding unit is not used, and an output value is directly generated. In this way, a decoding result of a decoder can be corrected, so that decoding performance is improved, and decoding complexity is reduced.

Figure 9:
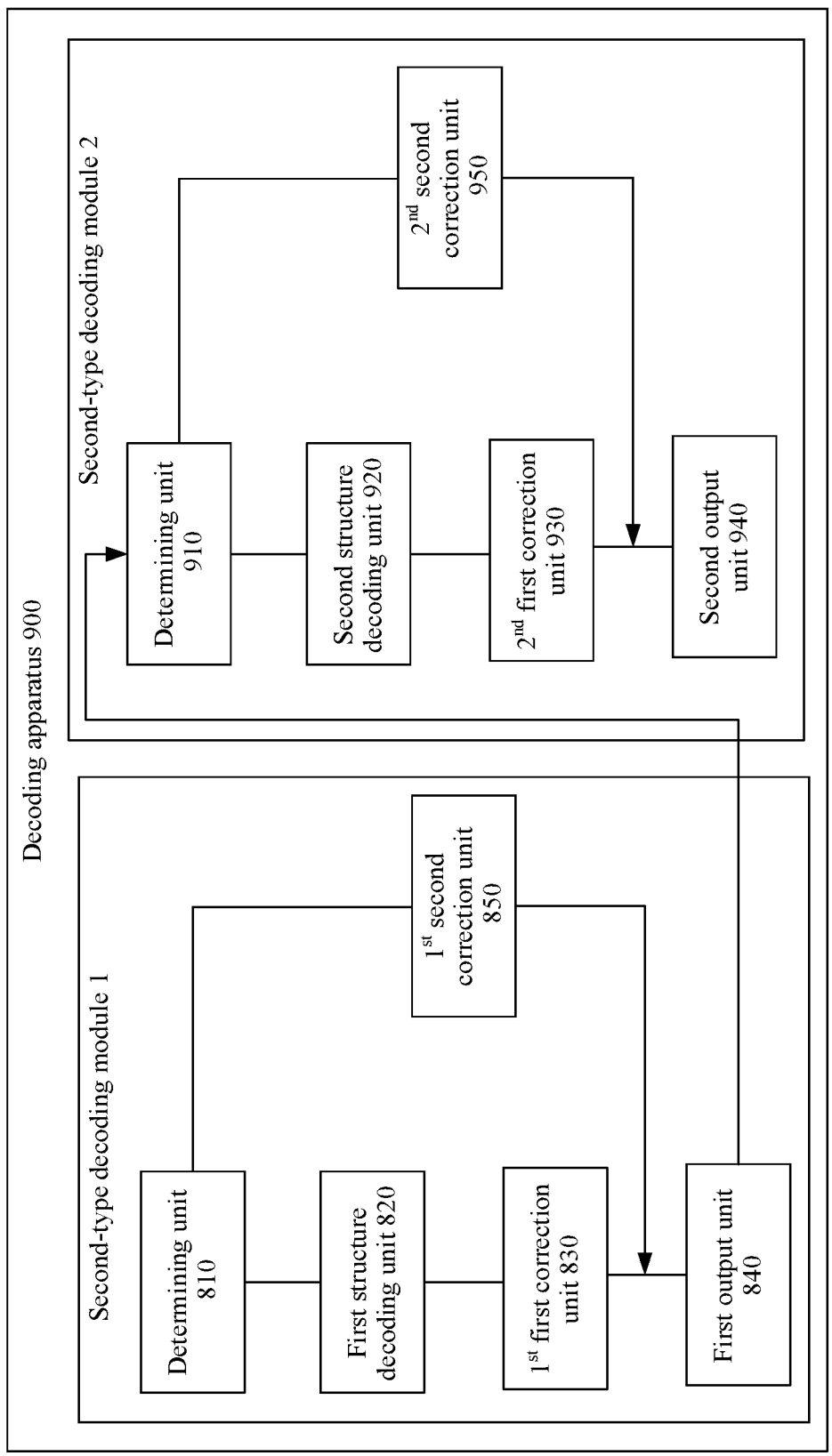
FIG. 9 is a schematic diagram of a decoding apparatus including two decoding modules of another type according to an embodiment of the present disclosure.

In a case, the decoding apparatus in this embodiment of the present disclosure may alternatively include two decoding modules of another type. As shown in FIG. 9, a decoding module 900 includes two second-type decoding modules: a second-type decoding module 1 and a second-type decoding module 2. The second-type decoding module 1 is described in FIG. 8, and details are not described herein again.

Similarly, the second-type decoding module 2 includes but is not limited to a determining unit 910, a second structure decoding unit 920, a $2^{nd}$ first correction unit 930, a second output unit 940, and a $2^{nd}$ second correction unit 950. The first output unit 840 may be directly communicatively connected to the determining unit 910, and the determining unit 910 may be directly communicatively connected to the second structure decoding unit 920. The second correction unit 920 may be directly communicatively connected to the $2^{nd}$ first correction unit 930, the $2^{nd}$ first correction unit 930 may be directly communicatively connected to the second output unit 940. The second output unit 940 may be directly communicatively connected to a structure decoding unit of another decoding module. The $2^{nd}$ second correction unit may be directly communicatively connected to the determining unit 910, and may also be directly communicatively connected to the second output unit 940.

The second structure decoding unit, the $2^{nd}$ first correction unit, the $2^{nd}$ second correction unit, and the second output unit each include an input port and an output port. The determining unit includes three ports, including one input port and two output ports. Specifically, the input port of the determining unit is configured to receive a first decoding result output by the first output unit, one output port of the determining unit is connected to the input port of the first structure decoding unit, and the other output port of the determining unit is connected to the input port of the $2^{nd}$ second correction unit. The output port of the second structure decoding unit is connected to the input port of the $2^{nd}$ first correction unit, and the output port of the $2^{nd}$ first correction unit is connected to the input port of the second output unit. The input port of the $2^{nd}$ second correction unit is connected to the determining unit, and the output port of the $2^{nd}$ second correction unit is connected to the input port of the second output unit. A connection relationship between the determining unit 810, the first structure decoding unit, the Pt first correction unit, and the first output unit is shown in FIG. 8.

The $2^{nd}$ first correction unit stores a $2^{nd}$ first correction model, and the $2^{nd}$ second correction unit stores a $2^{nd}$ second correction model.

In this embodiment of the present disclosure, the determining unit 910 is configured to determine whether the first decoding result output by the first output unit is a codeword. A specific determining method is described in the formula 2.

If a calculation result of the formula 2 is 0, it indicates that the first decoding result is a codeword. The determining unit outputs a signal 0, and the second structure decoding unit receives the signal 0 output by the determining unit. In this case, the second structure decoding unit decodes first to-be-decoded information to obtain a second decoding result. A specific decoding method is the same as that of the second structure decoding unit in FIG. 3. Details are not described herein again.

After the decoding result is obtained, the $2^{nd}$ first correction unit receives the decoding result and corrects the decoding result, to obtain a corrected second decoding result corresponding to the second decoding result.

In this embodiment of the present disclosure, the $2^{nd}$ first correction unit performs a correction process based on the $2^{nd}$ first correction model. The $2^{nd}$ first correction model may be pre-trained by an external training device, or the $2^{nd}$ first correction model may be obtained through training by the $2^{nd}$ first correction unit.

In this embodiment of the present disclosure, a training method and a training process of the $2^{nd}$ first correction model are the same as the training method and the training process of the second correction model. Similarly, the $2^{nd}$ first correction model may be a network. Specifically, for example, the $2^{nd}$ first correction model may be a fully-connected neural network model, a single neuron model, or an AI model.

In this embodiment of the present disclosure, the second-type decoding module 2 further includes the second output unit, configured to output the second decoding result corrected by using the $2^{nd}$ first correction unit.

Optionally, if a calculation result of the formula 2 is not 0, it indicates that the first decoding result is not a codeword, and the determining unit outputs a signal 1. In this case, the $2^{nd}$ second correction unit receives the signal 1 output by the determining unit and corrects the first decoding result, to obtain a first decoding result corrected again by using the first decoding result. Then, the second output unit directly outputs the corrected first decoding result.

In this embodiment of the present disclosure, the $2^{nd}$ second correction unit performs a correction process based on the $2^{nd}$ second correction model. The $2^{nd}$ second correction model may be pre-trained by an external training device, or the $2^{nd}$ second correction model may be obtained through training by the $2^{nd}$ second correction unit.

In this embodiment of the present disclosure, a training method and a training process of the $2^{nd}$ second correction model are the same as the training method and the training process of the second correction model. Similarly, the $2^{nd}$ second correction model may be a network. Specifically, for example, the $2^{nd}$ second correction model may be a fully-connected neural network model, a single neuron model, or an AI model.

In this embodiment of the present disclosure, the second output unit 940 is configured to output the decoding result corrected by using the $2^{nd}$ first correction model, or is configured to output the second decoding result corrected by using the $2^{nd}$ second correction unit. Specifically, the second output unit 940 may output, to a third structure decoder and a fourth structure decoder, the second decoding result corrected by using the $2^{nd}$ first correction unit or the $2^{nd}$ second correction unit, or output the second decoding result to an $N^{th}$ structure decoder and an $(N+1)^{th}$ structure decoder as an input.

In this embodiment of the present disclosure, when the decoding apparatus includes two second-type decoding modules, namely, the second-type decoding module 1 and the second-type decoding module 2, an input of the decoding apparatus is the first to-be-decoded information, and an output is a decoding result corresponding to the first to-be-decoded information, namely, the corrected second decoding result.

Specifically, the determining unit 910 determines the corrected first decoding result. If the determining unit 910 determines that the corrected first decoding result is a codeword, the determining unit 910 outputs a signal 0. The symbol received by the second structure decoding unit 920 from the channel and the corrected first decoding result are jointly used as second to-be-decoded information of the second structure decoding unit 920. The second structure decoding unit 920 decodes the second to-be-decoded information, to obtain a second decoding result. The second decoding result may be soft information or a hard output obtained after hard decision is performed. Subsequently, the $2^{nd}$ first correction unit 930 corrects the second decoding result. The $2^{nd}$ first correction unit 930 is also obtained through training based on training data. The training data includes a training decoding result and a corrected training decoding result. The training decoding result is a decoding result obtained after the second structure decoding unit 920 decodes training to-be-decoded information. The corrected training decoding result is a corrected decoding result corresponding to the training decoding result. Alternatively, if the determining unit 910 determines that the corrected first decoding result is not a codeword, the determining unit 910 outputs a signal 1. The $2^{nd}$ second correction unit 950 further corrects the corrected first decoding result, and the second output unit 940 outputs a corrected first decoding result.

Therefore, two decoding modules of another type in this embodiment of the present disclosure are used together. The determining unit is added to first determine to-be-decoded information. When the determining unit determines that the to-be-decoded information needs to be decoded, the second structure decoding unit and the second correction unit perform processing, and the second output unit outputs a result. When the determining unit determines that the to-be-decoded information does not need to be decoded, the $2^{nd}$ second correction unit corrects a result, the first structure decoding unit is not used, and an output value is directly generated. In this way, a decoding result of a decoder can be corrected, so that decoding performance is improved, and decoding complexity is reduced.

Figure 10:
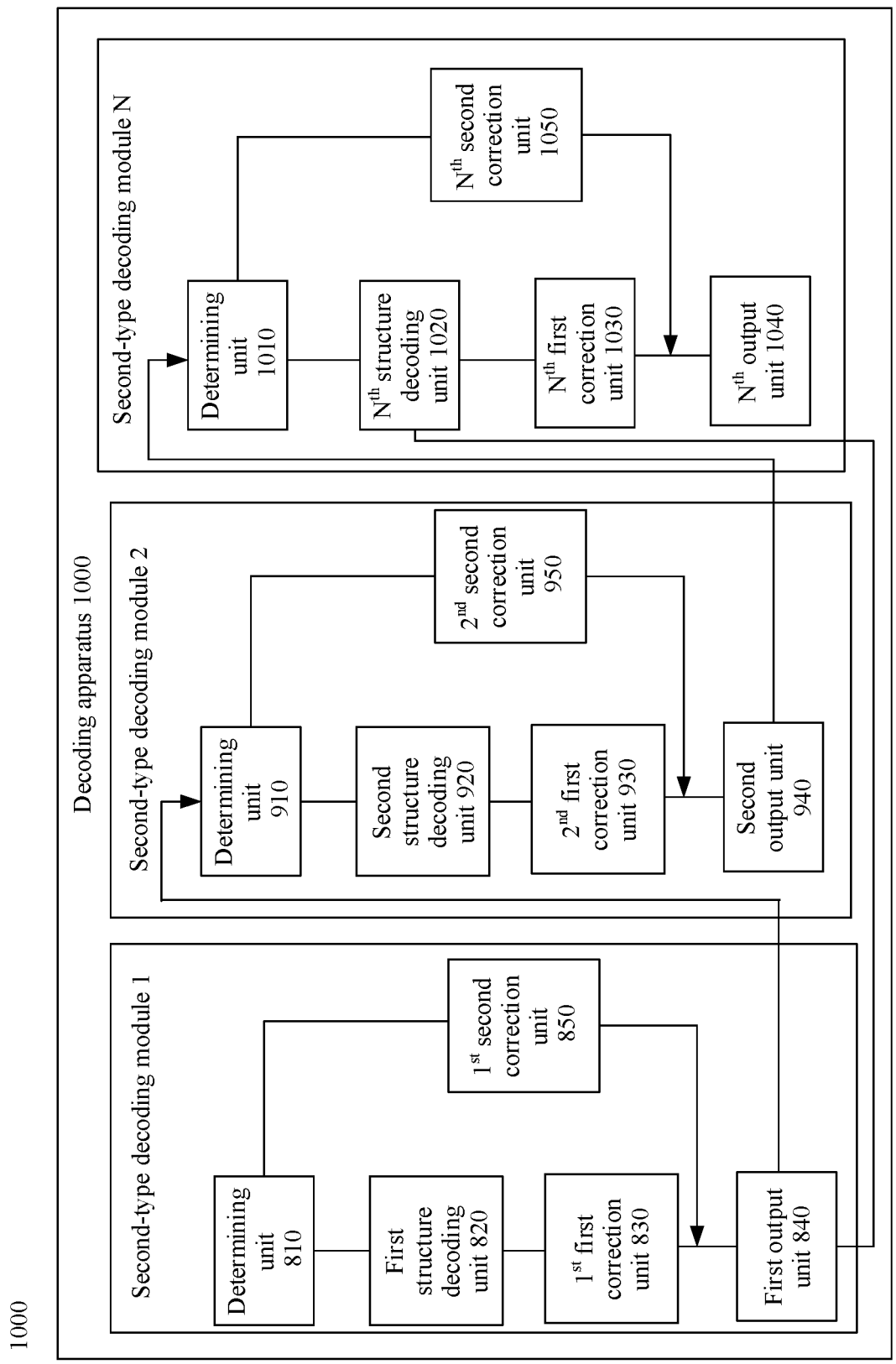
FIG. 10 is a schematic diagram of a decoding apparatus including a plurality of decoding modules of another type according to an embodiment of the present disclosure.

In another case, the decoding apparatus in this embodiment of the present disclosure may alternatively include a plurality of decoding modules of another type. As shown in FIG. 10, a decoding apparatus 1000 includes N second-type decoding modules: a second-type decoding module 1, a second-type decoding module 2, and a second-type decoding module N. Specifically, for example, the decoding apparatus 1000 may include the second-type decoding module 1, the second-type decoding module 2, and a second-type decoding module 3, or the decoding apparatus 1000 may include the second-type decoding module 1, the second-type decoding module 2, a second-type decoding module 3, and a second-type decoding module 4. A specific quantity of included decoding modules is not limited in this application, and another decoding apparatus including a plurality of second-type decoding modules falls within the protection scope of this application.

The second-type decoding module 1 and the second-type decoding module 2 are described in FIG. 9, and details are not described herein again. Similarly, the second-type decoding module N includes but is not limited to a determining unit 1010, an $N^{th}$ structure decoding unit 1020, an $N^{th}$ first correction unit 1030, an $N^{th}$ output unit 1040, and an $N^{th}$ second correction unit 1050. The determining unit 1010 may be directly communicatively connected to the $N^{th}$ structure decoding unit, and may further be directly communicatively connected to the $N^{th}$ second correction unit. The $N^{th}$ structure decoding unit 1010 may be directly communicatively connected to the $N^{th}$ first correction unit 1030. The $N^{th}$ first correction unit 1030 may be directly communicatively connected to the $N^{th}$ output unit 1040, and the $N^{th}$ second correction unit 1050 may be directly communicatively connected to the $N^{th}$ output unit 1040.

The $N^{th}$ structure decoding unit 1020, the $N^{th}$ first correction unit 1030, the $N^{th}$ second correction unit 1050, and the $N^{th}$ output unit 1040 each include an input port and an output port. Specifically, an input port of the determining unit is configured to receive an output of an $(N-1)^{th}$ output unit, one output port of the determining unit is connected to the input port of the $N^{th}$ structure decoding unit, and the other output port of the determining unit is connected to the input port of the $N^{th}$ second correction unit. The output port of the $N^{th}$ structure decoding unit is connected to the input port of the $N^{th}$ first correction unit, and the output port of the $N^{th}$ first correction unit is connected to the input port of the $N^{th}$ output unit. The input port of the $N^{th}$ second correction unit is connected to the determining unit, and the output port of the $N^{th}$ second correction unit is connected to the input port of the $N^{th}$ output unit. Connection manners of units in the second-type decoding module 1 and the second-type decoding module 2 are shown in FIG. 8 and FIG. 9.

The $N^{th}$ first correction unit stores an $N^{th}$ first correction model, and the $N^{th}$ second correction unit stores an $N^{th}$ second correction model.

Similarly, the determining unit 1010 is configured to determine whether a corrected $(N-1)^{th}$ decoding result is a codeword. A specific determining method is described in the formula 2.

As described in the formula 2, if a calculation result of the formula 2 is 0, it indicates that the $(N-1)^{th}$ decoding result is a codeword. The determining unit outputs a signal 0, and the $N^{th}$ structure decoding unit receives the signal 0 output by the determining unit. In this case, an $N^{th}$ decoder decodes a result obtained through probability superposition of the $(N-1)^{th}$ decoding result and an $(N-2)^{th}$ decoding result, to obtain an $N^{th}$ decoding result. A specific decoding method is the same as that of the first structure decoding unit 210 in FIG. 2. Details are not described herein again.

After the decoding result is obtained, the $N^{th}$ first correction unit receives the decoding result and corrects the decoding result, to obtain a corresponding corrected $N^{th}$ decoding result.

In this embodiment of the present disclosure, the $N^{th}$ first correction unit performs a correction process based on the $N^{th}$ first correction model. The $N^{th}$ first correction model may be pre-trained by an external training device, or the $N^{th}$ first correction model may be obtained through training by the $N^{th}$ first correction unit.

In this embodiment of the present disclosure, a training method and a training process of the $N^{th}$ first correction model are the same as the training method and the training process of the first correction model. Similarly, the $N^{th}$ first correction model may be a network. Specifically, for example, the $N^{th}$ first correction model may be a fully-connected neural network model, a single neuron model, or an AI model.

In this embodiment of the present disclosure, the second-type decoding module N further includes the $N^{th}$ output unit, configured to output the $N^{th}$ decoding result corrected by using the $N^{th}$ first correction unit.

Optionally, if a calculation result of the formula 2 is not 0, it indicates that the first to-be-decoded information is not a codeword, and the determining unit outputs a signal 1. In this case, the $N^{th}$ second correction unit receives the signal 1 output by the determining unit and corrects the $(N-1)^{th}$ decoding result again, to obtain an $(N-1)^{th}$ decoding result obtained after the $(N-1)^{th}$ decoding result is corrected again. Then, the $N^{th}$ output unit directly outputs the corrected $(N-1)^{th}$ decoding result.

In this embodiment of the present disclosure, the $N^{th}$ second correction unit performs a correction process based on the $N^{th}$ second correction model. The $N^{th}$ second correction model may be pre-trained by an external training device, or the $N^{th}$ second correction model may be obtained through training by the $N^{th}$ second correction unit.

In this embodiment of the present disclosure, a training method and a training process of the $N^{th}$ second correction model are the same as the training method and the training process of the first correction model. Similarly, the $N^{th}$ second correction model may be a network. Specifically, for example, the $N^{th}$ second correction model may be a fully-connected neural network model, a single neuron model, or an AI model.

In this embodiment of the present disclosure, the $N^{th}$ output unit 1040 is configured to output the decoding result corrected by using the $N^{th}$ first correction model, or is configured to output the $N^{th}$ decoding result corrected by using the $N^{th}$ second correction unit. Specifically, the $N^{th}$ output unit 1040 may output, to an $(N+1)^{th}$ structure decoder and an $(N+2)^{th}$ structure decoder as an input, the $N^{th}$ decoding result corrected by using the $N^{th}$ first correction unit or the $N^{th}$ second correction unit.

In this embodiment of the present disclosure, when the decoding apparatus includes a plurality of second-type decoding modules, the first to-be-decoded information is an input of the decoding apparatus. After the plurality of second-type decoding modules performs decoding processing on the first to-be-decoded information, the decoding modules output a decoding result corresponding to the first to-be-decoded information, namely, the $N^{th}$ corrected decoding result.

In the plurality of decoding modules of another type in this embodiment of the present disclosure, the determining unit is added to first determine to-be-decoded information. When the determining unit determines that the to-be-decoded information needs to be decoded, the $N^{th}$ structure decoding unit and the $N^{th}$ correction unit perform processing, and the $N^{th}$ output unit outputs a result. When the determining unit determines that the to-be-decoded information does not need to be decoded, the $N^{th}$ second correction unit corrects a result, the first structure decoding unit is not used, and an output value is directly generated. In this way, a decoding result of a decoder can be corrected, so that decoding performance is improved, and decoding complexity is reduced.

Figure 11:
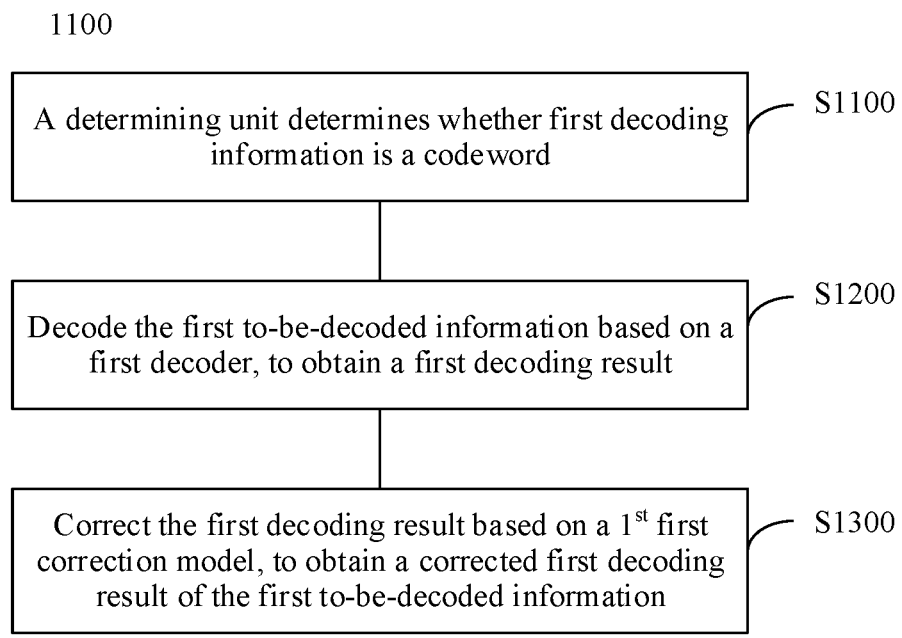
FIG. 11 is a schematic diagram of a decoding method performed by a single decoding module of another type according to an embodiment of the present disclosure.

FIG. 11 shows a decoding method performed by a single decoding module of another type according to an embodiment of the present disclosure. As shown in FIG. 11, the method includes the following steps.

S1100: A determining unit determines whether first decoding information is a codeword.

Specifically, the received first to-be-decoded information is determined according to the formula 2. If the determining unit determines that the received first to-be-decoded information is a to-be-decoded codeword, a to-be-decoded code block, a code block, or a codeword, the determining unit outputs a signal 0.

In this application, the determining unit may be a fully-connected network. The fully-connected network is obtained through training based on training data. The training data includes to-be-decoded information and checked to-be-decoded information, the to-be-decoded information is an input symbol received by a first decoder, and the checked to-be-decoded information is checked to-be-decoded information corresponding to the to-be-decoded information.

Optionally, the determining unit may alternatively be a preconfigured unit. For example, the determining unit may be an error detection apparatus.

S1200: The first decoder receives the signal 0 output by the determining unit, and the first decoder decodes the first to-be-decoded information to obtain a first decoding result, where the first decoding result includes first soft information or a first hard output.

S1300: A $1^{st}$ first correction model corrects the first decoding result, to obtain a corrected first decoding result of the first to-be-decoded information.

Optionally, in this embodiment of the present disclosure, the determining unit may alternatively determine that the first to-be-decoded information is not a codeword. In this case, 1 is output. Subsequently, the first decoder receives the signal 1, and the first decoder does not need to perform decoding. The first to-be-decoded information on which the determining unit performs determining is used as an input of the $1^{st}$ second correction model, and the $1^{st}$ second correction model corrects the first decoding information, to obtain a corrected first decoding result of the first to-be-decoded information. The $1^{st}$ second correction model is also obtained through training based on training data, and a training manner is the same as that of the $1^{st}$ first correction model.

In a case, in an embodiment of the present disclosure, the decoding method may be performed based on two decoding modules of another type. The decoding method performed by the two decoding modules of another type is as follows: Based on the decoding method in FIG. 11, before a second decoder decodes second to-be-decoded information (namely, the first decoding result), the determining unit determines whether the second decoding information is a codeword. A specific determining method is still described in the formula 2.

Specifically, the determining unit determines the received second to-be-decoded information. If the determining unit determines that the received second to-be-decoded information is a codeword, where the codeword may also be referred to as a to-be-decoded codeword, a to-be-decoded block, a code block, or a codeword, 0 is output. Subsequently, the second decoder receives the signal 0 output by the determining unit and decodes the second to-be-decoded information, to obtain a second decoding result.

Subsequently, the $2^{nd}$ first correction model corrects the second decoding result, to obtain a corrected second decoding result of the second to-be-decoded information.

Optionally, in this embodiment of the present disclosure, the determining unit may alternatively determine that the second to-be-decoded information is not a codeword. In this case, 1 is output. Subsequently, the second decoder receives the signal 1, and the second decoder does not need to perform decoding. The second to-be-decoded information determined by the determining unit is used as an input of the $2^{nd}$ second correction model. The $2^{nd}$ second correction model corrects the second decoding information, to obtain the corrected second decoding result of the second to-be-decoded information. The $2^{nd}$ second correction model is obtained through training based on training data, and a training manner is the same as that of the $2^{nd}$ first correction model.

In another case, in an embodiment of the present disclosure, the decoding method may be performed based on a plurality of decoding modules of another type. The decoding method performed by the plurality of decoding modules of another type is as follows: Based on the decoding method performed by two decoding modules, before an $N^{th}$ decoder decodes $N^{th}$ to-be-decoded information, the determining unit determines whether the $N^{th}$ decoding information is a codeword.

Specifically, the determining unit determines the received $N^{th}$ to-be-decoded information. A determining method is described in the formula 2. If the determining unit determines that the received $N^{th}$ to-be-decoded information is a codeword, where the codeword may also be referred to as a to-be-decoded codeword, a to-be-decoded code block, a code block, or a codeword, a signal 0 is output. Then, the $N^{th}$ decoder receives the signal 0 output by the determining unit and decodes the $N^{th}$ to-be-decoded information, to obtain an $N^{th}$ decoding result.

Subsequently, the $N^{th}$ first correction model corrects the $N^{th}$ decoding result, to obtain a corrected $N^{th}$ decoding result of the $N^{th}$ to-be-decoded information.

Optionally, in this embodiment of the present disclosure, the determining unit may alternatively determine that the $N^{th}$ to-be-decoded information is not a codeword. In this case, 1 is output. Subsequently, the $N^{th}$ decoder receives the signal 1, and the second decoder does not need to perform decoding. The $N^{th}$ to-be-decoded information determined by the determining unit is used as an input of the $N^{th}$ second correction model. The $N^{th}$ second correction model corrects the $N^{th}$ to-be-decoded information, to obtain a corrected $N^{th}$ decoding result of the $N^{th}$ to-be-decoded information. The $N^{th}$ second correction model is also obtained through training based on training data, and a training manner is the same as that of the $N^{th}$ first correction model.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A decoding method, comprising:
   decoding, by a first decoder, first to-be-decoded information to obtain a first decoding result that comprises first soft information or a first hard output;
   correcting, by the first decoder, the first decoding result based on a first correction model to obtain a corrected first decoding result of the first to-be-decoded information, wherein the first correction model is based on training data that comprises a training decoding result and a corrected training decoding result, wherein the training decoding result is obtained by after the first decoder decodes training to-be-decoded information, and wherein the corrected training decoding result corresponds to the training decoding result;
   decoding, by a second decoder, second to-be-decoded information to obtain a second decoding result, wherein the second to-be-decoded information comprises a first symbol from a channel and the corrected first decoding result, and wherein the second decoding result comprises second soft information or a second hard output; and
   correcting, based on a second correction model, the second decoding result to obtain a corrected second decoding result of the second to-be-decoded information.

2. The decoding method of claim 1, wherein the first to-be-decoded information comprises a symbol from a channel.

3. The decoding method of claim 1, wherein decoding the first to-be-decoded information comprises determining, by a first determiner, whether the first to-be-decoded information is a codeword.

4. The decoding method of claim 1, wherein decoding the second to-be-decoded information comprises determining, by a second determiner, whether the second to-be-decoded information is a first codeword.

5. The decoding method of claim 4, further comprising:
   decoding, by an $N^{th}$ decoder, $N^{th}$ to-be-decoded information to obtain an $N^{th}$ decoding result, wherein the $N^{th}$ to-be-decoded information comprises an $N^{th}$ symbol from the channel, a corrected $(N-1)^{th}$ decoding result, and a corrected $(N-2)^{th}$ decoding result, wherein the $N^{th}$ decoding result comprises $N^{th}$ soft information or an $N^{th}$ hard output, and wherein N is an integer greater than or equal to 3; and correcting, based on an $N^{th}$ correction model, the $N^{th}$ decoding result to obtain a corrected $N^{th}$ decoding result of the $N^{th}$ to-be-decoded information.

6. The decoding method of claim 5, wherein decoding the $N^{th}$ to-be-decoded information comprises determining, by an $N^{th}$ determiner, whether the $N^{th}$ to-be-decoded information is a second codeword.

7. The decoding method of claim 1, further comprising:
encoding a training information bit sequence to obtain the training to-be-decoded information, wherein the training information bit sequence is the corrected training decoding result;
decoding, by the first decoder, the training to-be-decoded information to obtain the training decoding result;
inputting the training decoding result into an original correction model to obtain a training decoding result corrected with the original correction model; and
adjusting a parameter of the original correction model until a deviation between the training decoding result and the training information bit sequence satisfy a preset condition, wherein an adjusted original correction model is the first correction model.

8. A decoding apparatus, comprising:
a first structure decoder configured to decode first to-be-decoded information to obtain a first decoding result that comprises first soft information or a first hard output;
a first corrector configured to correct the first decoding result based on a first correction model to obtain a corrected first decoding result of the first to-be-decoded information, wherein the first correction model is based on training data that comprises a training decoding result and a corrected training decoding result, wherein the training decoding result is obtained after the first structure decoder decodes training to-be-decoded information, and wherein the corrected training decoding result corresponds to the training decoding result;
a second structure decoder configured to decode second to-be-decoded information to obtain a second decoding result, wherein the second to-be-decoded information comprises a first symbol from a channel and the corrected first decoding result, and wherein the second decoding result comprises second soft information or a second hard output; and
a second corrector configured to correct the second decoding result based on a second correction model to obtain a corrected second decoding result of the second to-be-decoded information.

9. The decoding apparatus of claim 8, wherein the first structure decoder is configured to receive a symbol from a channel.

10. The decoding apparatus of claim 8, further comprising a first determiner configured to determine whether the first to-be-decoded information is a codeword.

11. The decoding apparatus of claim 8, further comprising a second determiner configured to determine whether the second to-be-decoded information is a first codeword.

12. The decoding apparatus of claim 11, further comprising:
an $N^{th}$ structure decoder configured to decode $N^{th}$ to-be-decoded information to obtain an $N^{th}$ decoding result, wherein the $N^{th}$ to-be-decoded information comprises an $N^{th}$ symbol from the channel, a corrected $(N-1)^{th}$ decoding result, and a corrected $(N-2)^{th}$ decoding result, wherein the $N^{th}$ decoding result comprises $N^{th}$ soft information or an $N^{th}$ hard output, and wherein N is an integer greater than or equal to 3; and
an $N^{th}$ corrector configured to correct the $N^{th}$ decoding result based on an $N^{th}$ correction model to obtain a corrected $N^{th}$ decoding result of the $N^{th}$ to-be-decoded information.

13. The decoding apparatus of claim 12, further comprising an $N^{th}$ determiner configured to determine whether the $N^{th}$ to-be-decoded information is a second codeword.

14. The decoding apparatus of claim 8, further comprising an encoder configured to encode a training information bit sequence to obtain the training to-be-decoded information, wherein the training information bit sequence is the corrected training decoding result, wherein the first structure decoder is further configured to decode the training to-be-decoded information to obtain the training decoding result, and wherein the decoding apparatus further comprises:
an original corrector configured to correct the training decoding result to obtain a training decoding result; and
a parameter adjuster configured to adjust a parameter of the original corrector until a deviation between the training decoding result corrected using the original corrector and the training information bit sequence satisfy a preset condition, wherein an adjusted original correction unit is the first correction unit.

15. A computer program product comprising instructions that are stored on a computer-readable medium and that, when executed by a processor, cause a decoding apparatus to:
decode, by a first decoder of the decoding apparatus, first to-be-decoded information to obtain a first decoding result that comprises first soft information or a first hard output;
correct, by the first decoder, the first decoding result based on a first correction model to obtain a corrected first decoding result of the first to-be-decoded information, wherein the first correction model is based on training data that comprises a training decoding result and a corrected training decoding result, wherein the training decoding result is obtained after the first decoder decodes training to-be-decoded information, and wherein the corrected training decoding result corresponds to the training decoding result;
decode, by a second decoder of the decoding apparatus, second to-be-decoded information to obtain a second decoding result, wherein the second to-be-decoded information comprises a second symbol from the channel and the corrected first decoding result, and wherein the second decoding result comprises second soft information or a second hard output; and
correct, based on a second correction model, the second decoding result to obtain a corrected second decoding result of the second to-be-decoded information.

16. The computer program product of claim 15, wherein the first to-be-decoded information comprises a first symbol from a channel.

17. The computer program product of claim 15, wherein when executed by the processor, the instructions cause the decoding apparatus to decode the first to-be-decoded information at least in part by determining, by a first determiner, whether the first to-be-decoded information is a codeword.

18. The computer program product of claim 15, wherein when executed by the processor, the instructions cause the decoding apparatus to determine whether the second to-be-decoded information is a first codeword.

19. The computer program product of claim 15, wherein when executed by the processor, the instructions cause the decoding apparatus to:
- decode $N^{th}$ to-be-decoded information to obtain an $N^{th}$ decoding result, wherein the $N^{th}$ to-be-decoded information comprises an $N^{th}$ symbol from the channel, a corrected (N−1)th decoding result, and a corrected (N−2)th decoding result, wherein the $N^{th}$ decoding result comprises $N^{th}$ soft information or an $N^{th}$ hard output, and wherein N is an integer greater than or equal to 3; and
- correct the $N^{th}$ decoding result based on an $N^{th}$ correction model to obtain a corrected $N^{th}$ decoding result of the $N^{th}$ to-be-decoded information.

20. The computer program product of claim 15, wherein when executed by the processor, the instructions cause the decoding apparatus to determine whether the $N^{th}$ to-be-decoded information is a second codeword.

\* \* \* \* \*

UNITED STATES PATENT AND TRADEMARK OFFICE
CERTIFICATE OF CORRECTION

PATENT NO. : 12,101,102 B2
APPLICATION NO. : 18/301724
DATED : September 24, 2024
INVENTOR(S) : Xianbin Wang et al.

Page 1 of 1

It is certified that error appears in the above-identified patent and that said Letters Patent is hereby corrected as shown below:

In the Claims

Claim 19, Column 37, Line 9: "(N-1)th decoding" should read "(N-1)$^{th}$ decoding"

Claim 19, Column 37, Line 10: "(N-2)th decoding" should read "(N-2)$^{th}$ decoding"

Signed and Sealed this
Twelfth Day of November, 2024

*Katherine Kelly Vidal*

Katherine Kelly Vidal
*Director of the United States Patent and Trademark Office*